United States Patent
Kawamura

(10) Patent No.: US 7,393,567 B2
(45) Date of Patent: Jul. 1, 2008

(54) PATTERN FORMING METHOD, ARRANGED FINE PARTICLE PATTERN FORMING METHOD, CONDUCTIVE PATTERN FORMING METHOD, AND CONDUCTIVE PATTERN MATERIAL

(75) Inventor: Koichi Kawamura, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 493 days.

(21) Appl. No.: 11/086,429

(22) Filed: Mar. 23, 2005

(65) Prior Publication Data

US 2005/0215721 A1 Sep. 29, 2005

(30) Foreign Application Priority Data

| Mar. 23, 2004 | (JP) | 2004-085653 |
| Mar. 25, 2004 | (JP) | 2004-090652 |
| Mar. 25, 2004 | (JP) | 2004-090653 |
| Mar. 22, 2005 | (JP) | 2005-082699 |

(51) Int. Cl.
  *B05D 1/32* (2006.01)
  *G03C 1/73* (2006.01)
(52) U.S. Cl. .................... 427/466; 430/286.1
(58) Field of Classification Search ............... 522/172, 522/174, 185; 430/270.1, 286.1; 427/466
See application file for complete search history.

(56) References Cited

U.S. PATENT DOCUMENTS

| 4,914,004 A | 4/1990 | Kohler et al. |
| 5,648,201 A * | 7/1997 | Dulcey et al. ................ 430/324 |
| 6,436,615 B1 * | 8/2002 | Brandow et al. ............ 430/324 |
| 6,447,920 B1 | 9/2002 | Chabrecek et al. |
| 6,878,470 B2 * | 4/2005 | Kawamura et al. .......... 428/690 |
| 2005/0208428 A1 * | 9/2005 | Kawamura et al. .......... 430/311 |
| 2005/0214550 A1 * | 9/2005 | Kawamura ................... 428/457 |

FOREIGN PATENT DOCUMENTS

| JP | 2828374 B2 | 11/1998 |
| JP | 2002-273209 A | 9/2002 |
| JP | 2004-31588 A | 1/2004 |

OTHER PUBLICATIONS

Y. Nakayama, et al., "Surface Macromolecular Microarchitecture Design: Biocompatible Surfaces via Photo-Black-Graft-Copolymerization Using N,N-Diethyldithiocarbarnate", Langmuir 1999, 15, pp. 5560-5566.

(Continued)

*Primary Examiner*—Susan W Berman
(74) *Attorney, Agent, or Firm*—Sughrue Mion, PLLC

(57) ABSTRACT

The present invention provides a pattern forming method comprising bonding a compound to a substrate, the compound having both a polymerization initiating moiety capable of undergoing photocleavage to initiate radical polymerization and a substrate bonding moiety, contacting a radical-polymerizable unsaturated compound with the substrate, and exposing light thereto patternwise, so as to form a region where a graft polymer is generated and a region where a graft polymer is not generated. A conductive pattern forming method applying the pattern forming method, and a conductive pattern material obtained by the conductive film forming method.

5 Claims, 1 Drawing Sheet

Z: FUNCTIONAL GROUP ON THE SURFACE OF SUBSTRATE
Q: SUBSTRATE BONDING MOIETY
Y: POLYMERIZATION INITIATING MOIETY

OTHER PUBLICATIONS

Michael D. K. Ingall, et al., Surface Functionalization and Imaging Using Monolayers and Surface-Grafted Polymer Layers, Journal of American Chemical Society, 1999, 121, pp. 3607-3613.

Rahul R. Shah, et al., "Using Atom Transfer Radical Polymerization to Amplify Monolayers of Initiators Patterned by Microcontact Printing into Polymer Brushes for Pattern Transfer", Macromolecules 2000, 33, pp. 597-605.

Ning Luo, et al., "A Methacrylated Photoiniferter as a Chemical Basis for Microlithography: Micropatterning Based on Photografting Polymerization", Macromolecules 2003, 36, pp. 6739-6745.

R. Maoz et al.: "Constructive Nanolithography: Inert Monolayers as Patternable Templates for In-Situ Nanofabrication of Metal Semiconductor" Advanced Materials, vol. 12, No. 10, 2000, pp. 725-731, XP000958769.

* cited by examiner

PATTERN FORMING METHOD, ARRANGED FINE PARTICLE PATTERN FORMING METHOD, CONDUCTIVE PATTERN FORMING METHOD, AND CONDUCTIVE PATTERN MATERIAL

CROSS-REFERENCE TO RELATED APPLICATION

This application claims priority under 35USC 119 from Japanese Patent Application Nos. 2004-085653, 2004-090653, 2004-090652 and 2005-82699 the disclosure of which are incorporated by reference herein.

BACKGROUND OF THE INVENTION

1. Field of the Invention

The present invention relates to a pattern forming method capable of easily forming a pattern having excellent resolution on the surface of a solid, an arranged fine particle pattern forming method capable of regularly arranging fine particles patternwise on a substrate, a conductive pattern forming method capable of forming a conductive pattern of silver, copper, or the like that has excellent durability on a substrate in a high density and that is excellent for production, and a conductive pattern material useful for electrical wiring material, electromagnetic wave preventive film, magnetic film, etc.

2. Description of the Related Art

The modification of the surface of a solid with a polymer has been widely studied in industrial fields since surface properties such as wetting, staining, adhesivity, surface friction, and cytotropism of a solid can be changed. Of these surface modification techniques, surface modification with a surface graft polymer involving the direct covalent bonding of a polymer to the surface of a solid is known to have the following characteristics:

i) This surface modification technique is advantageous in that a firm bond is formed between a surface and the graft polymer; and ii) Characteristic properties can be exhibited that are attributable to a large difference in affinity for material existing between a graft polymer and a polymer formed by ordinary spreading and crosslinking.

Various techniques have been proposed for the application of surface graft polymers having the aforementioned advantages by making the use of their characteristic properties. For example, these surface graft polymers are used in the arts relating to living organisms such as cell cultures, antithrombotic artificial blood vessels and artificial articulation, and the art of hydrophilic film and hydrophilic supports for printing plates requiring surface hydrophilicity.

Further, when such a graft polymer is formed patternwise, properties characteristic to the graft polymer are reflected in the pattern. Thus, graft polymers are used in various arts including printing plate precursor, divisional culturing, and dye image formation.

It is reported by Matsuda et al. in "Journal of biomedical materials research", 2000, vol. 53, page 584, that a hydrophilic graft pattern formed using a fixed polymerization initiator called "iniferter" fixed to a surface is used as a material for culturing cell divisions. It is also reported by Matsuda et al. in "Langumuir", 1999, vol. 15, page 5,560, that the adsorption of a dye (toluidine blue) to a graft pattern makes it possible to form a pattern of a visible image.

A technique for a graft polymer pattern obtained by patternwise polymerization of a hydrophilic or hydrophobic monomer in the presence of an iniferter polymerization initiator fixed to surface as well as a technique for obtaining a pattern of dye polymer by graftizing a monomer having a dye structure are reported by Metters, A. T. et al. in "Macromolecules", 2003, vol. 36, page 6,739.

A technique which comprises attaching an initiator imagewise to a gold substrate with a microcontact printing method, and then allowing the occurrence of atom transfer polymerization (ATRIP polymerization) in the presence of the initiator to form patternwise, for example, a HEMA (hydroxyethyl methacrylate) or MMA (methyl methacrylate) graft polymer that is then used as a resist is reported by C. J. Hawker et al. in "Macromolecules", 2000, vol. 33, page 597.

A method which comprises anion radical polymerization or cation radical polymerization of a silane compound fixed to a substrate to form a graft pattern is proposed by Ingall et al. in "J. Am. Chem. Soc.", 1999, vol. 121, page 3,607.

However, the aforementioned methods for preparing a graft pattern on the surface of a solid using iniferter method or atom transfer polymerization method of the related art are disadvantageous in that they require too long a reaction time and thus leave something to be desired in terms of production. The methods using anion radical polymerization or cation radical polymerization, too, are disadvantageous in that they require close control over the polymerization reaction and thus leave something to be desired for production.

It has thus been desired to provide a pattern forming method which comprises modifying the surface of a solid with a graft polymer to obtain an effective surface modified material or highly functional material. However, no methods capable of easily forming a graft polymer pattern within a practical production time have as yet been provided.

A technique for arranging fine particles is important for the performance enhancement of aspects such as surface area, resolution, and density of materials such as catalysts, recording materials, sensors, electronic devices and optical devices. Thus, this technique is under extensive study.

For example, Japanese Patent No. 2,828,374 proposes a particle agglomerating method which comprises developing a liquid dispersion medium of fine particles over a substrate to form a thin liquid layer, and then reducing the thickness of the liquid dispersion medium so that it is equal to or smaller than the particle diameter of the particles and thus cause the fine particles to agglomerate by surface tension. In accordance with the invention disclosed in the above cited patent, a layer of fine particles can be regularly agglomerated on a predetermined region to form a uniform particle-integrated layer. However, this technique is disadvantageous in that it is applied with difficulty for the purpose of arranging fine particles patternwise only in a desired region.

As a technique for arranging fine particles patternwise there is disclosed in Japanese patent application laid-open (JP-A) 2002-273209 a method which comprises patternwise exposure of the surface of an oxide substrate such as $TiO_2$ to light to form a hydrophilic and hydrophobic pattern thereon, and then arranging fine particles according to the pattern. The patterned fine particles obtained according to this method are merely physically adhered to the surface of the substrate and are not fixed to the surface of the substrate and thus can easily leave the substrate when stressed. Thus, this method cannot be applied to devices, etc. This method is also disadvantageous in that particles are adhered also to areas other than the predetermined pattern area. It has thus been desired to provide a method capable of forming a fixed particle pattern having high selectivity.

As another method for arranging fine particles patternwise there is known a patterned particle lamination method using a microstamp as disclosed by G. M. Whitesides in "Advanced Materials", vol. 8, page 245, 1996. In accordance with this method, polymer particles having a submicron size can be orderly integrated in a desired region. Further, the resulting pattern has high selectivity. However, this method is disadvantageous in that a difficult operation is required involving control over the rate of evaporation of solvent in the preparation of an orderly-integrated particle laminate structure, malting it difficult to prepare a desired pattern. This method is also disadvantageous in that it is not suitable for the formation of a large area pattern for these reasons. This method has a further disadvantage in that the adhesion between the patternwise laminated particles and the substrate is too weak, It has thus been desired to provide a method for the formation of a particle adhered pattern capable of attaining a practically sufficient adhesion.

Various conductive pattern materials have been heretofore used to form circuit boards. Referring to a typical example of such a technique, JP-A-2004-31588 discloses a method which comprises forming a thin layer of conductive material On an insulating material by a known method such as vacuum deposition, subjecting the thin layer to resist treatment, patternwise exposure of the resist to light to remove part of the resist, and then etching the material to form a desired pattern. This method requires at least four steps. In the case where a wet etching process is carried out, a step of disposing waste liquid is needed, making a complicated process necessary.

As another conductive pattern forming method there is known a conductive pattern material comprising a photoresist. This method comprises subjecting a substrate, that is coated with a photoresist polymer or that has a dry film-like photoresist adhered thereto, to exposure with ultraviolet light through an arbitrary photomask to form a lattice-shaped or otherwise shaped pattern. This method is useful for the formation of an electromagnetic wave shield requiring high electrical conductivity.

However, with the recent development of micromachines and the trend for further reduction in the size of super LSI, there has been a growing demand for the reduction in size of these wiring structures to a level as small as nanometers. The related art of metal etching is limited in its capability to reduce the size of wiring structures. Further, it is likely that fine wiring portions will when being worked.

As conductive patterns there have been noted not only continuous thin metal layers but also metal particle patterns obtained by allowing metal particles to be selectively adsorbed to a specific region.

Recently, with the development of an advanced information society, electronic appliances have seen remarkable development. In particular, the development of computer technology that supports the development of an advanced information society is greatly attributed to enhancement of the recording density of magnetic discs, not to mention enhancement of integration of semiconductor LSI. The enhancement of the recording density of magnetic discs requires the minimization of defects in the magnetic medium layer and the enhancement of smoothness of the magnetic medium layer.

To this end, a layer having magnetic metal particles dispersed in the surface of a substrate is used at present. It is further known that the patterning of metal particles makes it possible to enhance the recording capacity. In other words, patternwise formation of a metal particle adhered region has been more important. However, this method involving the formation of a fine metal particle pattern for the purpose of enhancing recording density has the same disadvantage as the aforementioned method for forming a thin metal layer pattern, making it difficult to form a fine metal particle pattern having high resolution.

SUMMARY OF THE INVENTION

The invention has been invented in consideration of the above-mentioned circumstances.

A first aspect of the invention is to provide a pattern forming method comprising: bonding a compound to a substrate, the compound having both a polymerization initiating moiety capable of undergoing photocleavage to initiate radical polymerization and a substrate bonding moiety, and contacting a radical-polymerizable unsaturated compound with the substrate, and exposing light thereto patternwise, so as to form a region where a graft polymer is generated and a region where a graft polymer is not generated.

A second aspect of the invention is to provide an arranged fine particle pattern forming method comprising; bonding a compound to a substrate, the compound having both a polymerization initiating moiety capable of undergoing photocleavage to initiate radical polymerization and a substrate bonding moiety, contacting a radical-polymerizable unsaturated compound with the substrate, and exposing light thereto patternwise, so as to form a region where a graft polymer is generated and a region where a graft polymer is not generated, and adhering fine particles to the region where the graft polymer is generated.

A third aspect of the invention is to provide a conductive pattern forming method comprising: bonding a compound to a substrate, the compound having both a polymerization initiating moiety capable of undergoing photocleavage to initiate radical polymerization and a substrate bonding moiety, contacting a radical-polymerizable unsaturated compound with the substrate, and exposing light thereto patternwise, so as to form a region where a graft polymer is generated and a region where a graft polymer is not generated, and providing a metal ion or a metal salt to the region where the graft polymer is generated, and reducing the metal ion or a metal ion in the metal salt to deposit a metal.

The fourth aspect of the invention is to provide a conductive pattern material obtained by the above conductive pattern forming method of the third aspect of the invention.

The fifth aspect of the invention is to provide a conductive pattern forming method comprising: bonding a compound to a substrate, the compound having both a polymerization initiating moiety capable of undergoing photocleavage to initiate radical polymerization and a substrate bonding moiety, contacting a compound, that has both a radical-polymerizable functional group and a functional group that interacts with either an electroless plating catalyst or a precursor thereof, with the substrate, and exposing light thereto patternwise, so as to form a region where a graft polymer is generated and a region where a graft polymer is not generated, and providing an electroless plating catalyst or a precursor thereof to the region where the graft polymer is generated, and carrying out electroless plating to form a patterned thin metal layer.

The sixth aspect of the invention is to provide a is to provide a conductive pattern material obtained by the above conductive pattern forming method of the fifth aspect of the invention.

DETAILED DESCRIPTION OF THE INVENTION

Figure 1:
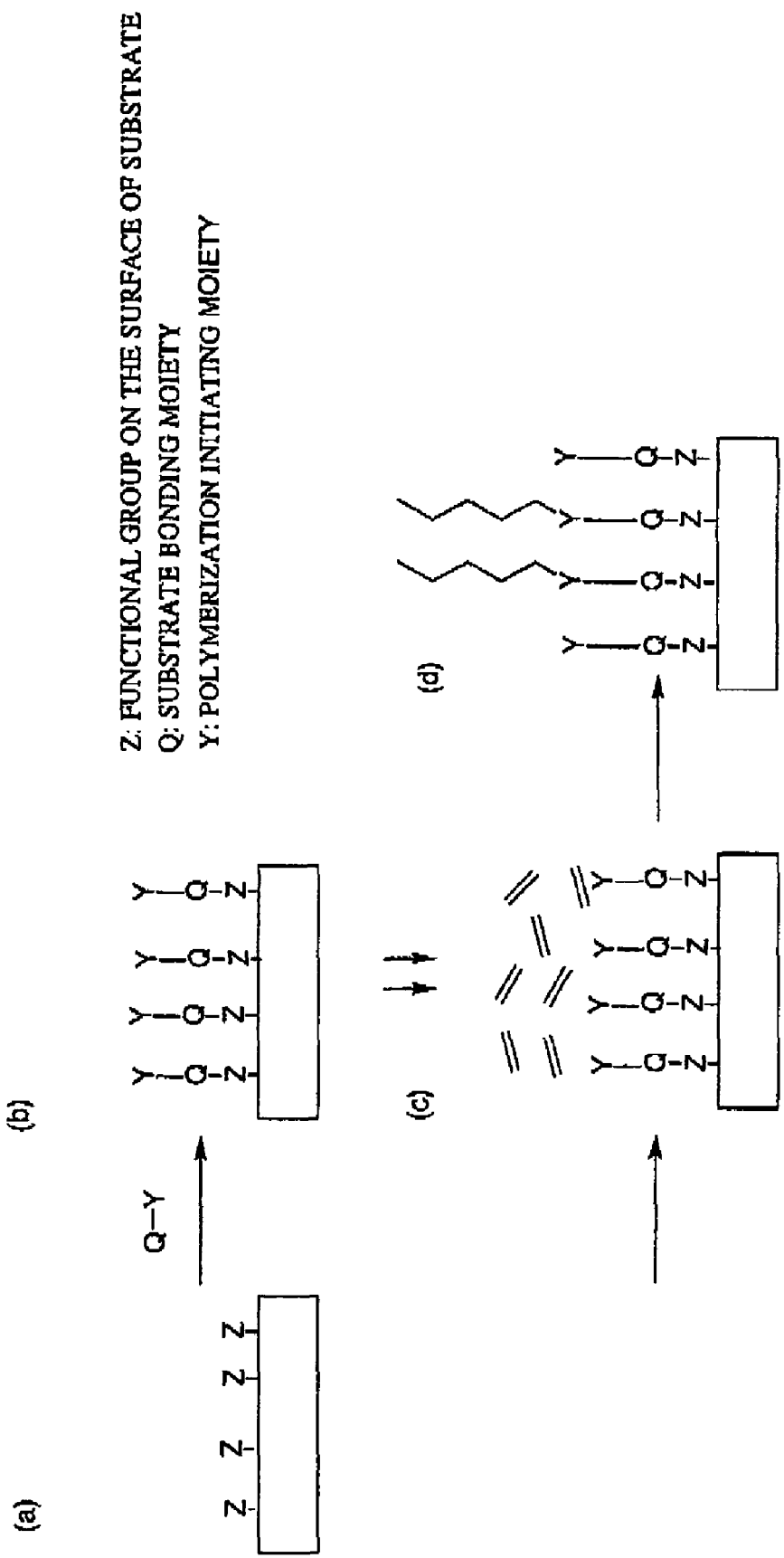
FIG. 1 shows a coinceptional diagram illustrating an outline of a pattern forming method according to the invention.

The invention will be further described hereinafter.

Pattern Forming Method:

The pattern forming method according to the invention pattern forming method comprising: bonding a compound to a substrate, the compound having both a polymerization initiating moiety capable of undergoing photocleavage to initiate radical polymerization and a substrate bonding moiety (hereinafter occasionally referred to as "photocleavable compound bonding step"), and contacting a radical-polymerizable unsaturated compound with the substrate, and exposing light thereto patternwise, so as to form a region where a graft polymer is generated and a region where a graft polymer is not generated(hereinafter occasionally referred to as "graft polymer generating step").

The detailed mechanism of the invention is not yet made obvious but may be presumed as follows. That is, the polymerization reaction of the invention involves a free radical polymerization that proceeds at a high rate and requires no close control, making it easy to form a graft polymer pattern on the surface of a solid.

First, the outline of the pattern forming method according to the invention will be described in connection with FIG. 1. FIG. 1 shows a conceptual diagram illustrating the outline of the pattern forming method according to the invention.

As shown in FIG. 1A, the substrate originally has a functional group (represented by Z) present on the surface thereof. A compound (Q-Y) having a substrate bonding moiety (O) and a photopolymerization initiating moiety (Y) which can undergo photocleavage to initiate radical polymerization is provided to the substrate so that it comes in contact with the surface of the substrate. In this manner, the functional group (Z) present on the surface of the substrate and the substrate bonding moiety (O) are bonded to each other so that the compound (Q-Y) is introduced to the surface of the substrate as shown in FIG. 1B [photocleavable compound bonding step]. Thereafter, the substrate is exposed to light patternwise with a known graft polymer material such as monomer in contact with the substrate as shown in FIG. 1C. In this manner, a graft polymer is generated in the exposed area with the polymerization initiating moiety (Y) in the compound (Q-Y) as a starting point (a region where a graft polymer is generated) while no graft polymer is generated in the unexposed area (a region where a graft polymer is not generated) as shown in FIG. 1D [graft polymer generating step].

The aforementioned pattern forming method will be further described hereinafter.

The group represented by Z in FIG. 1 is a functional group present on the surface of the substrate. Specific examples of the functional group include hydroxyl group, carboxyl group, and amino group. Such a functional group may be originally present on the surface of the substrate due to the properties of the substrate such as silicon substrate and glass substrate. Alternatively, such a functional group may be allowed to exist on the surface of the substrate by subjecting the substrate to surface treatment such as corona treatment.

The structure of the compound having a photopolymerization initiating moiety which can undergo photocleavage to initiate radical polymerization (hereinafter simply referred to as "polymerization initiating moiety") and a substrate bonding moiety will be further described hereinafter. Referring further to this compound in connection with a model of compound (Q-Y) having a substrate bonding side (O) and a polymerization initiating moiety (Y), the polymerization initiating moiety (Y) is generally a structure comprising a single bond capable of undergoing cleavage by light.

Examples of the single bond capable of undergoing cleavage by light include single bonds capable of undergoing cleavage by utilizing α-cleavage of carbonyl, β-cleavage of carbonyl, light-free rearrangement reaction of carbonyl, cleavage reaction of phenacyl ester, cleavage reaction of sulfonimide, cleavage reaction of sulfonyl ester, cleavage reaction of N-hydroxysulfonyl ester, cleavage reaction of benzylimide, cleavage reaction of active halogen compound, etc. When the aforementioned compound undergo such a reaction, the single bond capable of undergoing cleavage by light is severed. Examples of the single bond capable of undergoing cleavage include a C—C bond, a C—N bond, a C—O bond, a C—Cl bond, a N—O bond, and a S—N bond.

When the polymerization initiating moiety (Y) containing such a single bond capable of undergoing cleavage by light undergoes cleavage of the single bond by light, the polymerization initiating moiety (Y) causes the generation of radical because it acts as a starting point of graft polymerization at the graft polymer generating step. Examples of the structure of the radical-generating polymerization initiating moiety (Y) having a single bond capable of undergoing cleavage by light include those containing the following groups.

Aromatic ketone groups, phenacyl ester groups, sulfonimide groups, sulfonyl ester groups, N-hydroxysulfonyl ester groups, benzylimide groups, trichloromethyl groups, benzyl chloride groups, etc.

A radical generated by the cleavage of the polymerization initiating moiety (Y) by exposure can act as a starting point for graft polymerization reaction to generate a desired graft polymer if there is a polymerizable compound around the radical (a region where a graft polymer is generated). At the unexposed area, on the other hand, the polymerization initiating moiety (Y) undergoes no cleavage, causing no production of graft polymer (a region where a graft polymer is not generated).

The substrate bonding moiety (O) is composed of a reactive group capable of reacting with the functional group Z present on the surface of the substrate to undergo bonding. Specific examples of such a reactive group include the following groups.

Q: substrate bonding group

The polymerization initiating moiety (Y) and the substrate bonding moiety (O) may be bonded to each other directly or via a connecting group. Examples of the connecting group include those containing atoms selected from the group consisting of carbon, nitrogen, oxygen and sulfur. Specific examples of the connecting group include saturated carbon groups, aromatic groups, ester groups, amide groups, ureido groups, ether groups, amino groups, and sulfonamide groups.

These connecting groups may further have substituents. Examples of the substituents include alkyl groups, alkoxy groups, and halogen atoms.

Specific examples [Exemplary Compounds 1 to 16] of the compound (Q-Y) having a substrate bonding moiety (Q) and a polymerization initiating moiety (Y) will be given below with cleavage portions, but the invention is not limited thereto.

C—C bond-cleavable type

1.

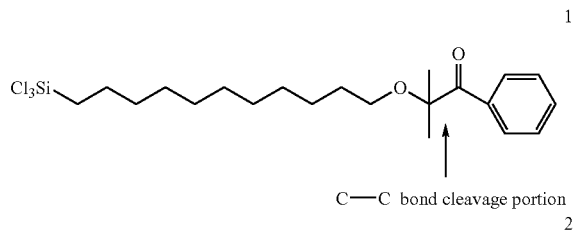

2.

C—C bond cleavage portion

3.

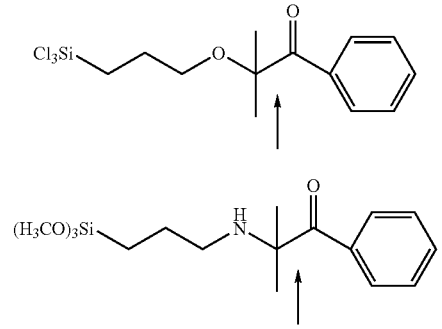

4.

5.

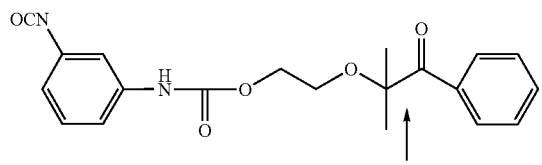

6.

C—O bond-cleavable type

7.

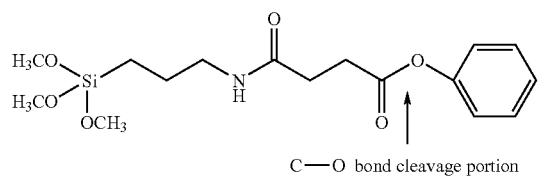

C—O bond cleavage portion

8.

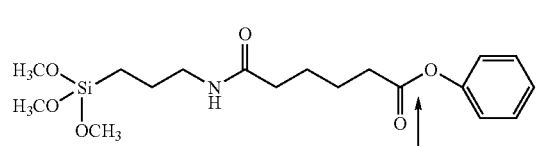

-continued

9.

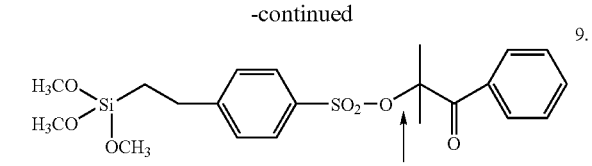

S—N bond-cleavable type

10.

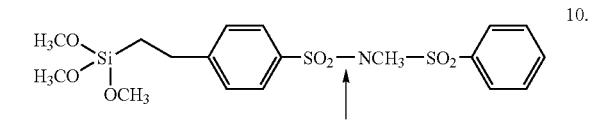

S—N bond cleavage portion

11.

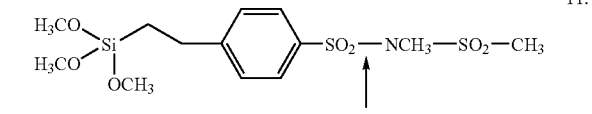

12.

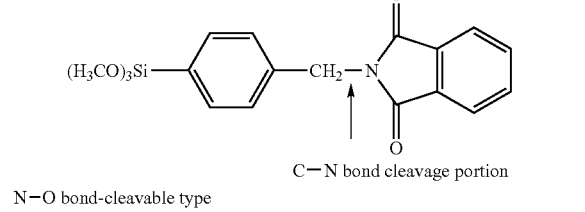

C—N bond cleavage portion

N—O bond-cleavable type

13.

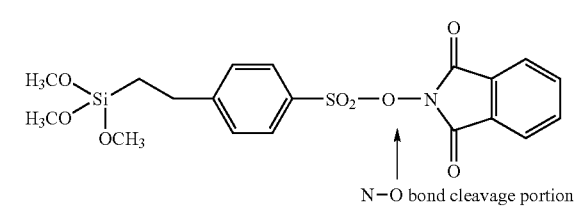

N—O bond cleavage portion

C—Cl bond-cleavable type

14.

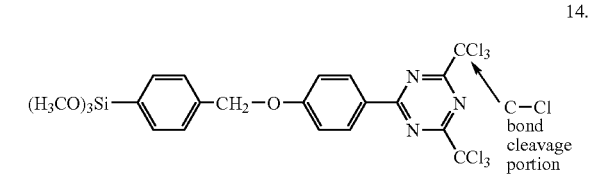

C—Cl bond cleavage portion

15.

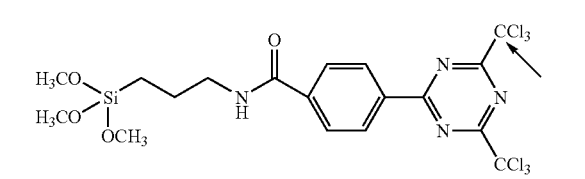

16.

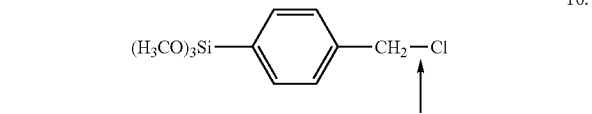

The photocleavable compound bonding step of the invention involves the bonding of such a compound (Q-Y) to the substrate.

As a method of bonding such an exemplified compound (Q-Y) to the functional group Z present on the surface of the substrate there may be used a method which comprises dissolving or dispersing the compound (Q-Y) in a proper solvent such as toluene, hexane and acetone, and then coating the solution or dispersion over the surface of the substrate, or a method which comprises dipping the substrate in the solution or dispersion. In these methods, the concentration of the compound (Q-Y) in the solution or dispersion is preferably from 0.01% by mass to 30% by mass, particularly from 0.1% by mass to 15% by mass. The temperature of the solution or dispersion to be in contact with the substrate is preferably from 0° C. to 100° C. The time during which the solution or dispersion comes in contact with the substrate is preferably from 1 second to 50 hours, more preferably from 10 seconds to 10 hours.

The substrate to be used in the invention is not specifically limited. As the substrate of the invention there may be used a substrate having on the surface thereof a functional group which acts as a starting point for the generation of graft polymer, such as hydroxyl group, carboxyl group and amino group, or a substrate which has been subjected to surface treatment such as corona treatment to generate hydroxyl group, carboxyl group or the like.

A tabular substrate is generally used, but the invention is not necessarily limited to tabular substrate. The graft polymer may be similarly introduced into the surface of a substrate having an arbitrary shape such as cylinder.

Specific examples of the substrate to be used in the invention include various substrates having surface hydroxyl group such as glass, quartz, ITO and silicon, and plastic substrates such as PET, polypropylene and polyimide which have been subjected to surface treatment such as corona treatment to produce hydroxyl group, carboxyl group or the like.

The thickness of the substrate may be predetermined depending on the purpose and is not specifically limited. However, the thickness of the substrate is normally from 10 μm to 10 cm.

The bonding of the compound (Q-Y) to the surface of the substrate is followed by the graft polymer generating step.

At the graft polymer generating step, a radical-polymerizable unsaturated compound (e.g., hydrophilic monomer) which is a material of the desired graft polymer is contacted with the substrate which has been subjected to treatment at the aforementioned photocleavable compound bonding step. Thereafter, patternwise exposing to light is carried out so that the polymerization initiating group on the exposed area is activated to generate a radical. With the radical as a starting point, the radical-polymerizable unsaturated compound undergoes graftization reaction. As a result, a graft polymer is produced only on the exposed area.

Examples of the method of contacting the radical-polymerizable unsaturated compound with the surface of the substrate include a method which comprises coating a solution or dispersion of the radical-polymerizable unsaturated compound over the surface of the substrate, and a method which comprises dipping the substrate in the solution or dispersion.

As the radical-polymerizable unsaturated compound to be used at the graft polymer generating step there may be used any compound having a radical-polymerizable group. Examples of such a radical-polymerizable unsaturated compound include hydrophilic monomers, hydrophobic monomers, macromers, oligomers, and polymers having polymerizable unsaturated group. In the invention, hydrophilic monomers are particularly preferred.

Radical-polymerizable unsaturated compounds to be used at the graft polymer generating step will be specifically exemplified.

—Hydrophilic Polymer Having Polymerizable Unsaturated Group—

The term "hydrophilic polymer having polymerizable unsaturated group" as used herein is meant to indicate a radical-polymerizable group-containing hydrophilic polymer having an ethylene addition-polymerizable unsaturated group such as a vinyl group, an allyl group and a (meth)acryl group incorporated in its molecule. This radical-polymerizable group-containing hydrophilic polymer needs to have a polymerizable group at the terminal of main chain and/or in its chain, preferably both at the terminal of main chain and in its chain. The hydrophilic polymer having a polymerizable group (at the terminal of main chain and/or in its chain) will be referred to as "radical-polymerizable group-containing hydrophilic polymer" hereinafter.

Such a radical-polymerizable group-containing hydrophilic polymer can be synthesized in the following manner.

Examples of the synthesis method employable herein include (a) a method involving the copolymerization of a hydrophilic monomer with a monomer having an ethylene addition-polymerizable unsaturated group, (b) a method which comprises copolymerizing a hydrophilic monomer with a monomer having a double bond precursor, and then subjecting the copolymer to treatment with a base or the like so that a double bond is incorporated in the copolymer, and (c) a method involving the reaction of the functional group of a hydrophilic polymer with an ethylene addition-polymerizable unsaturated group. Particularly preferred among these methods is the method involving the reaction of the functional group of a hydrophilic polymer with an ethylene addition-polymerizable unsaturated group from the standpoint of adaptability to synthesis.

Examples of the hydrophilic monomer to be used in the synthesis of the radical-polymerizable group-containing hydrophilic polymer in the aforementioned methods (a) and (b) include carboxyl groups, sulfonic acid groups, phosphoric acid groups, amino groups, salts thereof, and monomers having a hydrophilic group such as hydroxyl group, amide group and ether group, e.g., (meth)acrylic acid, alkaline metal and amine salts thereof, itaconic acid, alkaline metal and amine salts thereof, 2-hydroxyethyl (meth)acrylate, (meth) acrylamide, N-monomethylol (meth)acryl amide, N-dimdethylol (meth)acrylamide, allylamine, hydrohalogenic acid salts thereof, 3-vinylpropionic acid, alkaline metal and amine salts thereof, vinylsulfouic acid, alkaline metal and amine salts thereof, 2-sulfoethyl (meth)acrylate, polyoxyethylene glycol mono(meth)acrylate, 2-acrylamide-2-methyl propanesulfonic acid, acid phosphoxypolyoxyethylene glycol mono (meth)acrylate.

Examples of the hydrophilic polymer to be used in the method (c) include hydrophilic homopolymers or copolymers obtained from at least one selected from the group consisting of these hydrophilic monomers.

As the monomer having an ethylene addition-polymerizable unsaturated group copolymerizable with hydrophilic monomer during the synthesis of radical-polymerizable group-containing hydrophilic polymer in the method (a) there may be used, e.g., allyl group-containing monomer. Specific examples of such an allyl group-containing monomer include allyl (meth)acrylate, and 2-allyloxyethyl methacrylate.

As the monomer having a double bond precursor copolymerizable with hydrophilic monomer during the synthesis of radical-polymerizable group-containing hydrophilic polymer in the method (b) there may be used 2-(3-chloro-1-oxopropoxy)ethyl methacrylate.

As the monomer having an addition-polymerizable unsaturated group to be used in the introduction of unsaturated group by the reaction of carboxyl group, amino group or salt thereof in the hydrophilic polymer with a functional group such as hydroxyl group and epoxy group during the synthesis of radical-polymerizable group-containing hydrophilic polymer in the method (c) there may be used (meth)acrylic acid, glycidyl (meth)acrylate, allyl glycidyl ether, 2-isocyanato ethyl (meth)acrylate or the like.

—Hydrophilic Macromonomer—

As methods of producing macromonomers which can be used in the invention there have been proposed various methods in Yuya Yamashita, "Chemistry and Industry of Macromonomer", IPC Shuppankyoku, Chapter 2 ("Synthesis of Macromonomers"), Sep. 20, 1989.

Particularly useful examples of the hydrophilic macromonomers employable herein include macromonomers derived from carboxyl group-containing monomers such as acrylic acid and methacrylic acid, sulfonic acid-based macromonomers derived from monomers such as 2-acrylamide-2-methyl propanesulfonic acid, vinylstyrenesulfonic acid and salt thereof, amide-based macromonomers derived from (meth)acrylamide, N-vinyl acetamide, N-vinylformamide and N-vinylcarboxylic acid amide monomer, macromonomers derived from hydroxyl group-containing monomers such as hydroxyethyl methacrylate, hydroxyethyl acrylate and glycerol monomethacrylate, and macromonomers derived from alkoxy group or ethylene oxide group-containing monomers such as methoxyethyl acrylate, methoxypolyethylene glycol acrylate and polyethylene glycol acrylate. Further, monomers having a polyethylene glycol chain or polypropylene glycol chain, too, can be used as macromonomers of the invention.

The molecular weight of useful one among these hydrophilic macromonomers is preferably from 250 to 100,000, particularly from 400 to 30,000.

—Hydrophilic Monomer—

As the hydrophilic monomer there may be used a monomer having a positive charge such as ammonium and phosphonium or a monomer having a negative charge or an acid group which can be dissociated to negative charge such as salfonic acid group, carboxyl group, phosphoric acid group and phosphonic acid group. Besides these hydrophilic monomers, hydrophilic monomers having a nonionic group such as hydroxyl group, amide group, sulfonamide group, alkoxy group and cyano group may be used.

Specific examples of the hydrophilic monomers employable herein include the following monomers.

For example, (meth)acrylic acid, alkaline metal and amine salts thereof, itaconic acid, alkaline metal and amine salts thereof, allylamine, hydrohalogenic acid salts thereof, 3-vinylpropionic acid, alkaline metal and anine salts thereof, vinylsulfonic acid, alkaline metal and amine salts thereof, styrenesulfonic acid, alkaline metal and amine salts thereof, 2-sulfoethylene (meth)acrylate, 3-sulfopropylene (meth) acrylate, alkaline metal and amine salts thereof, 2-acrylamide-2-methyl propanesulfonic acid, 2-acrylamide-2-methyl propanesulfonic acid, acid phosphoxypolyoxyethylene glycol mono(meth)acrylate, salts thereof, 2-dimethylaminoethyl (meth)acrylate, hydrohalogenic acid salts thereof, 3-trimethylammonium propyl (meth)acrylate, 3-trimethylammoniumpropyl (meth)acrylate, N,N,N-trimethyl-N-(2-hydroxy-3-methacryloyloxypropyl)ammonium chloride, etc. may be used. Further, 2-hydroxyethyl (meth)acrylate, (meth)acrylamide, N-monomethylol (meth)acrylamide, N-dimethylol (meth)acrylamide, N-vinylpyrrolidone, N-vinylacetamide, polyoxyethylene glycol mono(meth) acrylate, or the like may be used.

—Solvent—

The solvent to be used in the dissolution or dispersion of the aforementioned radical-polymerizable unsaturated compound is not specifically limited so far as it can dissolve the radical-polymerizable unsaturated compound and additives added as necessary.

For example, in the ease where a hydrophilic compound such as hydrophilic monomer is used, water or an aqueous solvent such as water-soluble solvent is preferably used. A mixture of these aqueous solvents or such an aqueous solvent having a surface active agent incorporated therein is preferred. The term "water-soluble solvent" as used herein is meant to indicate a solvent which can be mixed with water at an arbitrary ratio. Examples of such a water-soluble solvent include alcohol-based solvents such as methanol, ethanol, propanol, ethylene glycol and glycerin, acids such as acetic acid, ketone-based solvents such as acetone, and amide-based solvents such as formamide.

Further, in the case where a hydrophobic compound such as hydrophobic monomer is used, an alcohol-based solvent such as methanol, ethanol and 1-methoxy-2-propanol, ketone-based solvent such as methyl ethyl ketone or hydrocarbon-based solvent such as toluene is preferably used.

The exposure method to be used in the pattern forming method of the invention is not specifically limited, Ultraviolet rays or visible light may be used so far as they can provide an energy high enough to cause cleavage at the aforementioned polymerization initiating moiety (Y).

Examples of the light source to be used in the patternwise exposure include ultraviolet rays, deep ultraviolet rays, and laser light. Preferred among these light sources are ultraviolet rays and laser light.

The resolution of the pattern formed in the invention depends on the exposure conditions.

The use of the pattern forming method of the invention makes it possible to form a pattern having a high resolution. By effecting patternwise exposure for recording of a highly fine image, a highly fine pattern can be formed according to exposure. Examples of the exposure method for the formation of a highly fine pattern include light beam scanning exposure using an optical system, and exposure using a mask. Any exposure method may be used depending on the desired resolution of pattern.

Specific examples of the highly fine pattern exposure method include stepper exposure methods such as i-ray stepper exposure, KrF stepper exposure and ArF stepper exposure.

The substrate which has been thus subjected to the pattern forming method of the invention to form a region where a graft polymer is generated and a region where a graft polymer is not generated is then subjected to treatment such as dipping in solvent to remove the remaining homopolymer so that it is purified. In some detail, the substrate is washed with water or acetone, and then dried. From the standpoint of removability of homopolymer, means such as ultrasonic cleaning is preferably employed.

The substrate which has been thus purified has no homopolymer left behind on the surface thereof but only a patterned graft polymer firmly bonded thereto.

In accordance with the pattern forming method of the invention, a fine pattern can be easily formed according to the resolution of exposure. Thus, the pattern forming method of the invention can be widely applied.

Arranged Fine Particle Pattern Forming Method

The arranged fine particle pattern forming method of the invention involves the use of the aforementioned pattern forming method of the invention, and comprises bonding a compound to a substrate, the compound having both a polymerization initiating moiety capable of undergoing photocleavage to initiate radical polymerization and a substrate bonding moiety, contacting a radical-polymerizable unsaturated compound with the substrate, and exposing light thereto patternwise, so as to form a region where a graft polymer is generated and a region where a graft polymer is not generated, and adhering fine particles to the region where the graft polymer is generated.

In the arranged fine particle pattern forming method of the invention, the polymerization initiating moiety preferably contains any selected from the group consisting of a C—C bond, a C—N bond, a C—O bond, a C—Cl bond, a N—O bond and a S—N bond.

Further, the graft polymer according to the invention preferably has a polar group therein. It is particularly preferred that the graft polymer have a polar group in its side chains. It is particularly preferred that the polar group be an ionic group which can be dissociated to ions.

The detailed mechanism of the arranged fine particle pattern forming method of the invention is not yet definite but may be presumed as follows. In other words, the polymerization reaction of the invention involves free radical polymerization as mentioned above and thus proceeds at a high rate. Further, the polymerization reaction of the invention requires no close control. Accordingly, a graft pattern can be easily formed on the surface of a solid.

Further, the graft polymer formed by the method of the invention is chemically bonded to the compound having a polymerization initiating moiety and a substrate bonding moiety connected to the surface of the substrate at one terminal thereof. In this arrangement, the graft polymer is extremely firmly fixed to the substrate. Further, since the graft polymer is fixed to the substrate at one terminal thereof but is free at the other, the graft polymer has little restraint and hence an extremely high movability. Thus, the graft polymer produced by the method of the invention has a functional group having a high polarity incorporated in its molecule in addition to the aforementioned basic properties such as high movability and firm bond to the substrate. In this arrangement, an interaction is formed between the graft polymer having a polar group and the fine particles, making it possible to adhere the fine particles to the graft polymer dynamically firmly.

As a result, fine particles can be adhered selectively and firmly according to the finely patterned graft polymer-produced region having a high resolution.

The mechanism of adhesion of fine particles is not specifically limited. Any of ionic adsorption by polar group, ion group, etc., electrostatic adsorption/adhesion and adsorption/adhesion by dipole interaction may be included in the invention.

Further, in accordance with the invention, when fine particles are adhered to the region where the graft polymer is generated to form interaction between the graft polymer and the fine particles as mentioned above, the region where the graft polymer is generated has very high particle adhering properties as compared with the region where the graft polymer is not generated, making it possible to fully remove even slight particles adhered to areas other than the desired area by cleaning. As a result, an arranged fine particle pattern having an extremely high selectivity can be obtained.

The arranged fine particle pattern forming method of the invention will be further described hereinafter.

As mentioned above, the arranged fine particle pattern forming method of the invention comprises bonding a compound to a substrate, the compound having both a polymerization initiating moiety capable of undergoing photocleavage to initiate radical polymerization and a substrate bonding moiety (hereinafter occasionally referred to as "photocleavable compound bonding step"), contacting a radical-polymerizable unsaturated compound with the substrate, and exposing light thereto patternwise, so as to form a region where a graft polymer is generated and a region where a graft polymer is not generated (hereinafter occasionally referred to as "graft polymer generating step"), and adhering fine particles to the region where the graft polymer is generated (hereinafter occasionally referred to as "fine particle adhering step").

<Photocleavable Compound Bonding Step>

The "photocleavable compound bonding step" in the arranged fine particle pattern forming method of the invention involves the bonding of a compound having a polymerization initiating moiety capable of undergoing photocleavage to initiate radical polymerization and a substrate bonding moiety to a substrate.

For the details of the "photocleavable compound bonding step", reference can be made to that in the aforementioned pattern forming method of the invention.

<Graft Polymer Generating Step>

The "graft polymer generating step" in the conductive pattern forming method of the invention is a step of contacting a radical-polymerizable unsaturated compound with the substrate which has carried out the "photocleavable compound bonding step", and exposing light thereto patternwise, so as to form a region where a graft polymer is generated and a region where a graft polymer is not generated.

For the details of the "graft polymer generating step", reference can be made to that in the aforementioned pattern forming method of the invention.

As the radical-polymerizable unsaturated compound to be used in the present step there may be used any compound having a radical-polymerizable group. Examples of such a compound include hydrophilic monomers, hydrophobic monomers, macromers, oligomers, and polymers having polymerizable unsaturated group. As the compound having radical-polymerizable group of the invention there may be preferably used a hydrophilic polymer, macromer or monomer having a hydrophilic group as a polar group from the standpoint of adhesion/adsorption of fine particles.

In accordance with the aforementioned "photocleavable compound bonding step" and "graft polymer generating step", a fine pattern is formed according to the resolution of exposure composed of the region where the graft polymer is generated and the region where the graft polymer is not generated.

<Fine Particle Adhering Step>

In the arranged fine particle pattern forming method of the invention, the "photocleavable compound bonding step" and "graft polymer generating step" are followed by the "Fine particle adhering step" which will be described in detail hereinafter.

In the Fine particle adhering step of the invention, fine particles are adhered to the graft polymer thus produced. By attaching various functional fine particles adapted to the properties of the graft polymer, fine particles are imagewise arranged. In this manner, the desired region allows the fine particles to exhibit their excellent functions. The adhesion of fine particles will be further described hereinafter.

1. Exemplification of Fine Particles

As the fine particles to be used in the arranged fine particle pattern forming method of the invention there may be used any fine particles which can be adhered to the aforementioned graft polymer. Since a preferred embodiment of the graft polymer is one having a polar group as already described, the fine particles of the invention preferably have physical properties such that they can produce interaction with the polar group and can be bonded thereto. The fine particles to be used may be properly predetermined depending on the purpose of the functional surface to be formed. Further, the diameter of the fine particles can be predetermined depending on the purpose.

Further, the diameter of the fine particles can be predetermined depending on the purpose. The diameter of the fine particles vary with the purpose but are normally preferably from 0.1 nm to 1 μm, more preferably from 1 nm to 300 nm, particularly from 5 nm to 100 nm.

In a preferred embodiment of implementation of the invention, fine particles are ionically adsorbed. Accordingly, it goes without saying that the diameter and the adsorbed amount of fine particles are limited by the surface charge of the fine particles and the number of ionic groups.

Referring to the form of adsorption of fine particles to the graft polymer in the arranged fine particle pattern forming method of the invention taking ionic group as polar group, the fine particles are arranged regularly almost in a single layer or such that none nanoscale fine particle is adsorbed to each of ionic groups in the long graft polymer to form a multi-layer arrangement, depending on the existing conditions of ionic groups in the graft polymer.

The functional fine particles which can be used as fine particles according to the invention will be further described hereinafter in connection with specific examples.

1-1. Fine Particles for Optical Material

In the case where the arranged fine particle pattern forming method of the invention is used to prepare an optical material, as the functional particulate material there is preferably used at least one particulate material selected from particulate resin and particulate metal oxide.

As the particulate resin there may be used a particulate material having a central portion (called "core") made of an organic polymer. As the particulate metal oxide there may be used silica ($SiO_2$), titanium oxide ($TiO_2$), zinc oxide (ZnO), tin oxide ($SnO_2$) or the like. Alternatively, a particulate pigment called transparent pigment or white pigment such as calcium carbonate, aluminum hydroxide, magnesium hydroxide, clay and talc may be used so far as it has a desired shape as mentioned below.

The particulate resin preferably has a high hardness from the standpoint of durability. In some detail, a spherically particulate material made of a resin such as acrylic resin, polystyrene resin, polyethylene resin, epoxy resin and silicon resin may be used. In particular, a particulate crosslinked resin is preferred. In this usage, the diameter of the particulate resin is preferably from 10 nm to 900 nm, particularly from 100 nm to 700 nm, which falls within the visible light wavelength range. In this embodiment, the particles which are ionically bonded to the graft polymer are arranged regularly almost in a single layer.

As the functional particulate material to be used in the case where the arranged fine particle pattern forming method of the invention is used to prepare a color filter, sharp cut filter or nonlinear optical material for optical apparatus there may be used a particulate material made of semiconductor such as CdS and CdSe or a metal such as gold. In this case, when silica glass or alumina glass is used as a substrate, the resulting product can be used as a color filter or the like. Further, since this product is confirmed to have a great three-dimensional optical nonlinear receptivity, the product can be expected as a nonlinear optical material for optical switch, optical memory material, etc. Specific examples of the particulate material to be used herein include particulate materials made of noble metal such as gold, platinum, silver and palladium or alloy thereof. From the standpoint of stability, materials which are not suddenly dissolved in alkali, such as gold and platinum, are preferably used.

Referring further to the case where the arranged fine particle pattern forming method of the invention is used to prepare the aforementioned nonlinear optical material, as the ultrafinely particulate material of metal (compound) to be preferably used there may be used an ultrafinely particulate material having an average particle diameter of from 10 to 1,000 angstrom made of a simple body such as gold (Au), silver (Ag), copper (Cu), platinum (Pt), palladium (Pd), rhodium (Rh), osmium (Os), iron (Fe), nickel (Ni) and ruthenium (Ru) or alloy of at least one of these simple bodies. Referring to the particle diameter, the particulate material may be either primary or secondary. The particulate material preferably doesn't scatter visible light. In particular, a particulate noble metal selected from the group consisting of Au, Pt, Pd, Rh and Ag or particulate metal selected from the group consisting of Ti, V, Cr, Mn, Fe, Ni, Cu, Zn, Cd, Y, W, Sn, Ge, In and Ga having a particle diameter of 10 run or less dispersed independently in a solvent such as toluene is preferred.

In the case where these ultrafinely particulate materials are used to prepare a nonlinear optical material using an ordinary method such as sol-gel method, dipping method, sputtering method, ion planting method and vapor to liquid deposition method, it has been disadvantageous in that the particulate material can be easily agglomerated, making it difficult to increase the concentration of fine particles in the composite or causing the drop of productivity. In particular, those having so low a concentration of fine particles that the fine particles have little contribution to physical properties are limited in usage and thus are not suitable for image memory and optical integrated circuit utilizing three-dimensional nonlinear optical effect. On the contrary, the particulate material of the invention is chemically bonded ionically to the ionic group (polar group) in the graft polymer bonded to the surface of the substrate. These ionic groups are present in the graft polymer in a high density, making it easy to increase the concentration of fine particles. Accordingly, the resulting optical material, too, is suitable particularly for such a nonlinear optical material.

1-2. Particulate Material for Organic Light-emitting Element

In the case where the fine particle adhered pattern forming method of the invention is used to prepare an organic light-emitting element, when fine particles obtained by agglomerating organic dye molecules which emit light when excited by hot carrier are used as functional fine particles to form a layer containing these fine particles on the surface of a substrate having an electrode, an organic light-emitting element can be formed. Examples of the organic dye employable herein include the following organic dyes. However, the invention is of course not limited to these organic dyes. The organic dye to be used herein is properly selected taking into account the purpose, etc.

Examples of the organic dye constituting the fine particles for organic light-emitting element include blue light-emitting oxazole-based dyes such as p-bis [2-(5-phenyloxazole)]benzene (POPOP), green light-emitting coumarine-based dyes such as coumarine 2, coumarine 6, coumarine 7, coumarine 24, coumarine 30, coumarine 102 and coumarine 540, red light-emitting rhodamine-based (red) dyes such as rhodamine 6G, rhodamine B, rhodamine 101, rhodamine 110, rhodamine 590 and rhodamine 640, and oxazine-based dyes capable of emitting light in near infrared range and suitable for optical functional element adapted for optical communication such as oxazine 1, oxazine 4, oxazine 9 and oxazine 118.

Further examples of the organic dye include cyanine-based dyes such as phthalocyanine and cyanine iodide compound. Among these dyes, those which can be easily dissolved in a polymer such as acrylic resin are preferably selected for the purpose of forming a thin layer. Examples of these dyes include POPOP, coumarine 2, coumarine 6, coumarine 30, rhodamine 6G, rhodamine B, and rhodamine 101.

Further, fine particles formed by an organic molecule to be used in organic electroluminescence (EL) film, e.g., 8-hydroxyquinoline aluminum ($Alq_3$), 1,4-bis (2,2-diphenylvinyl)biphenyl, polyparaphenylene vinylene (PPV) derivatives, distyryl arylene derivatives, styryl biphenyl derivatives, phenanthroline derivatives, or media obtained by adding additives to these organic molecules may be used.

1-3. Other Fine Particles

Useful examples of the fine particles according to the invention other than the above exemplified fine particles include the following compounds.

Particulate metal oxides such as iron oxide, titanium oxide, zinc oxide, cobalt oxide, chromium oxide, tin oxide and antimony oxide, inorganic compounds such as silicon oxide, zirconium oxide, titanium oxide, alumina, magnesium oxide and tin oxide, and ultrafinely particulate materials of metal such as aluminum, tin and zinc.

While the fine particles to be used in the arranged fine particle pattern forming method of the invention has been described, the invention is not limited thereto. It goes without saying that various fine particle adhesion patterns having a functional surface which can make the use of physical properties possessed by the functional particulate material can be formed according to the purpose.

2. Physical Properties of Surface of Particulate Material

If the aforementioned various particulate materials have charge themselves like particulate silica, a graft polymer having a polar group having a charge opposite that of the particulate material may be formed on the surface of the substrate.

Further, if a particulate material having no charge itself like particulate gold is used, a particle surface modifier having a charge is used to prepare a particulate material having a charge which is then adhered/adsorbed to the graft polymer. The use of the latter method makes it possible to increase the width of the degree of selection during the use of the particulate material.

Examples of the method of attaching the aforementioned particulate material to the graft polymer to form an arranged fine particle pattern include (1) a method which comprises spreading a dispersion of a particulate material having a charge over the graft polymer-produced area of a substrate having a graft polymer formed imagewise thereon, and (2) a method which comprises dipping a substrate having a graft polymer formed imagewise thereon in a dispersion of a particulate material.

These particulate materials are preferably adhered to the substrate in the maximum amount that they can be adhered/adsorbed to the polar groups present in the graft polymer from the standpoint of durability. Therefore, in both the methods (1) and (2), it is preferred that excessive amount of charged particulate material be supplied and the time during which the dispersion comes in contact with the substrate having a graft polymer imagewise formed thereon be from 10 about seconds to 180 minutes, more preferably from about 1 minute to 100 minutes to form sufficient interaction between the polar group in the graft polymer and the particulate material. Further, the dispersed concentration of the particulate material in the dispersion is preferably from about 10 to 20% by mass from the standpoint of efficiency in the accomplishment of functionality on the functional surface.

3. Form of Adhesion of Particulate Material to Graft Polymer

Referring to specific forms of adhesion of particulate material, an ionic monomer such as ammonium having a positive charge may be used as a polar group to imagewise form a graft polymer having ammonium group on the surface of the substrate. Thereafter, the substrate is dipped in a dispersion of particulate silica for a predetermined period of time so that the particulate silica is patternwise adsorbed to the substrate. The substrate is then washed with water to remove extra dispersion. The substrate is then lightly rubbed with cotton or the like to fully remove particles from areas other than the desired area. Thus, an arranged fine particle pattern having a patternwise adhesion of silica particles is formed.

In this manner, a graft polymer can be imagewise formed on the substrate. The aforementioned fine particles can be adhered to the graft polymer to provide an arranged fine particle pattern having a desired function. The thickness of the arranged fine particle pattern thus formed may be predetermined according to the purpose but is normally preferably from 0.001 μm to 10 μm, more preferably from 0.005 μm to 5 μm, most preferably from 0.01 μm to 1 μm. When the thickness of the arranged fine particle pattern is too small, the arranged fine particle pattern tends to have deteriorated scratch resistance. On the contrary, when the thickness of the arranged fine particle pattern is too great, the arranged fine particle pattern tends to have deteriorated adhesion.

4. Usage

Exemplifying further the usage of the arranged fine particle pattern obtained by the arranged fine particle pattern forming method of the invention, proper selection of particulate material makes it possible to accomplish various functions on the functional surface. For example, the use of a conductive organic or inorganic particulate material makes it possible to accomplish electronic/electrical functions on the functional surface. The use of a magnetic particulate material such as particulate ferrite makes it possible to accomplish magnetic functions on the functional surface. The use of a particulate material capable of absorbing, reflecting or scattering light having a specific wavelength makes it possible to accomplish optical functions on the functional surface. Accordingly, the arranged fine particle pattern of the invention can find wide application in the art of various industrial products, medicines, catalysts, varistors (variable resistor), coating compounds, cosmetic products, etc. In addition to these various functions possessed by the various constituents of particulate material, a polymer material can be used as a substrate, making it possible to utilize the moldability of the polymer material. Thus, it can be expected to develop a novel material.

Specific examples of the aforementioned wide application include various OA devices or household appliances such as image-forming material having colorant particles adhered thereto, optical parts to be used in nonlinear optical element, local shield film against ultraviolet ray, visible light, infrared ray, etc., fish net, television parts, telephone parts, OA device parts, electric cleaner parts, fan parts, air conditioner parts, refrigerator parts, washing machine parts, humidifier parts and tableware drier parts, sanitary parts such as stool and washstand parts, other building materials, vehicle parts, daily goods, toys, and miscellaneous. Conductive pattern forming method and conductive pattern material.

The conductive pattern material forming method and conductive pattern material of the invention involve the use of the aforementioned pattern forming method of the invention.

In other words, the first embodiment of implementation of the conductive pattern material forming method of the invention comprises bonding a compound to a substrate, the compound having both a polymerization initiating moiety capable of undergoing photocleavage to initiate radical polymerization and a substrate bonding moiety, contacting a radical-polymerizable unsaturated compound with the substrate, and exposing light thereto patternwise, so as to form a region where a graft polymer is generated and a region where a graft polymer is not generated, providing a metal ion or a metal salt to the region where the graft polymer is generated, and reducing the metal ion or a metal ion in the metal salt to deposit a metal.

In the present embodiment, the step of reducing the metal ion or metal ion in the metal salt to deposit a metal may be further followed by a heating step.

The first embodiment of implementation of the conductive pattern material of the invention is obtained by the above first embodiment of implementation of the conductive pattern material forming method of the invention.

The graft polymer in the first embodiment of the aforementioned conductive pattern forming method or conductive pattern of the invention preferably has a polar group therein. It is particularly preferred that the graft polymer have a polar group in its side chain. The polar group is preferably an ionic group which can be dissociated to ions. The region where the graft polymer is generated in the present embodiment is preferably a hydrophilic region.

In the first embodiment of the conductive pattern forming method or conductive pattern material of the invention, a metal ion or metal salt is provided to the graft polymer bonded directly to the substrate as mentioned above. The metal ion or a metal ion in the metal salt is reduced to deposit a metal. In this manner, a continuous thin metal layer or a metal particle adhered layer having metal particles adhered dispersedly to the graft polymer is patternwise formed. This thin metal layer or metal particle adhered layer exhibits an electrical conductivity as well as high strength and abrasion resistance.

In the invention, methods of providing a metal ion and/or metal salt in the first embodiment can be roughly divided into (1) a method which comprises allowing a metal ion to be adsorbed by a region where a graft polymer is generated composed of a compound having a polar group (ionic group), (2) a method which comprises impregnating a region where a graft polymer is generated composed of a compound having a high affinity for metal salt such as polyvinyl pyrrolidone with a metal salt or a solution containing a metal salt and (3) a method which comprises impregnating a hydrophilic graft polymer-produced region with a solution containing a metal salt or having a metal salt dissolved therein.

In accordance with the aforementioned embodiment (3), even if the compound constituting the hydrophile graft polymer-produced region has a positive charge, a necessary metal ion or metal salt can be provided.

The second embodiment of implementation of the conductive pattern material forming method of the invention comprises bonding a compound to a substrate, the compound having both a polymerization initiating moiety capable of undergoing photocleavage to initiate radical polymerization and a substrate bonding moiety, contacting a compound, that has both a radical-polymerizable functional group and a functional group that interacts with either an electroless plating catalyst or a precursor thereof, with the substrate, and exposing light thereto patternwise, so as to form a region where a graft polymer is generated and a region where a graft polymer is not generated, providing an electroless plating catalyst or a precursor thereof to the region where the graft polymer is generated, and carrying out electroless plating to form a patterned thin metal layer.

The first embodiment of implementation of the conductive pattern material of the invention is obtained by the above second embodiment of implementation of the conductive pattern material forming method of the invention.

In the each embodiment of implementation of the conductive pattern forming method or conductive pattern material of the invention, the compound having a polymerization initiating moiety capable of undergoing photocleavage to initiate radical polymerization and a substrate bonding moiety preferably contains any selected from the group consisting of a C—C bond, a C—N bond, a C—O bond, a C—Cl bond, a N—O bond and a S—N bond as the polymerization initiating moiety.

In the second embodiment of implementation of the conductive pattern forming method or conductive pattern material of the invention, a graft polymer having a functional group interacting with an electroless plating catalyst or a precursor thereof is patternwise formed. An electroless plating catalyst or precursor a thereof is then provided to the region where the graft polymer is generated. Then, the electroless plating is carried out to form a thin metal layer. In this embodiment, too, a graft polymer having a functional group interacting with an electroless plating catalyst or precursor thereof is bonded to the substrate. Thus, the thin metal layer formed exhibits an electrical conductivity as well as high strength and abrasion resistance as in the aforementioned first embodiment.

In accordance with the invention, a region where a graft polymer is generated having a high resolution can be easily formed on the substrate when the substrate is subjected to scanning exposure based on digital data or patternwise exposure using a predetermined mask pattern. The detailed mechanism of this procedure is not yet definite. However, it is thought that since the polymerization reaction for the production of graft polymer involves free radical polymerization which proceeds at a high rate and requires no close control, a graft polymer pattern can bc easily formed on the surface of a solid.

The graft polymer constituting the region where the graft polymer is generated thus formed is chemically bonded to the compound having a polymerization initiating moiety and a substrate bonding moiety connected to the surface of the substrate at one terminal thereof. In this arrangement, the graft polymer is extremely firmly fixed to the substrate. Further, since the graft polymer is fixed to the substrate at one terminal thereof but is free at the other, the graft polymer has little restraint and hence an extremely high movability.

Therefore, the region where the graft polymer is generated of the invention can form a highly fine graft polymer pattern having a high strength even if it is a thin layer. In the case where the metal salt or the like is ionically adhered (adsorbed) to the graft polymer, the molecules thus adsorbed to the graft polymer are firmly fixed to the graft polymer. Thus, a thin metal region having a high strength can be formed. In particular, in the case where the metal region forms a thin metal layer (continuous layer), it is thought that a fine wiring pattern free of break can be formed.

Further, in the invention, the graft polymer has an extremely high movability as mentioned above. Therefore, the adhesion (adsorption) rate is extremely high as compared with that in the case where a metal is adsorbed to an ordinary crosslinked polymer layer, increasing the amount of metal which can be adsorbed to unit area. Therefore, in the case where the adsorbed amount of metal is controlled to form a continuous thin metal layer or a high density metal particle adhered layer is heated to fuse adjacent metal particles to each other to form a continuous metal layer, a fine wiring pattern can be formed. When such a wiring is formed, electrical conductance cannot be prevented or wire break cannot occur due to voids present between metals.

The conductive pattern forming method and conductive pattern material of the invention will be further described hereinafter.

1. Conductive Pattern Forming Method

The first embodiment of implementation of the conductive pattern forming method of the invention bonding a compound to a substrate, the compound having both a polymerization initiating moiety capable of undergoing photocleavage to initiate radical polymerization and a substrate bonding moiety (hereinafter occasionally referred to as "photocleavable compound bonding step"), contacting a radical-polymerizable unsaturated compound with the substrate, and exposing light thereto patternwise, so as to form a region where a graft polymer is generated and a region where a graft polymer is not generated (hereinafter occasionally referred to as "graft polymer generating step"), providing a metal ion or a metal salt to the region where the graft polymer is generated (hereinafter referred to as "metal ion or metal salt providing step"), and reducing the metal ion or a metal ion in the metal salt to deposit a metal (hereinafter occasionally referred to as "metal (particle) layer forming step").

The second embodiment of implementation of the conductive pattern forming method of the invention comprises bonding a compound to a substrate, the compound having both a polymerization initiating moiety capable of undergoing photocleavage to initiate radical polymerization and a substrate bonding moiety, (photocleavable compound bonding step), contacting a compound, that has both a radical-polymerizable functional group and a functional group that interacts with either an electroless plating catalyst or a precursor thereof, with the substrate, and exposing light thereto patternwise, so as to form a region where a graft polymer is generated and a region where a graft polymer is not generated (graft polymer generating step), providing an electroless plating catalyst or a precursor thereof to the region where the graft polymer is generated (hereinafter occasionally referred to as "electroless plating catalyst providing step") and carrying out electroless plating to form a patterned thin metal layer (hereinafter occasionally referred to as "electroless plating step").

<Photocleavable Compound Bonding Step>

The "photocleavable compound bonding step" in the conductive pattern forming method of the invention involves the bonding of a compound to a substrate, the compound having a polymerization initiating moiety capable of undergoing photocleavage to initiate radical polymerization and a substrate bonding moiety.

For the details of the "photocleavable compound bonding step", reference can be made to that in the aforementioned pattern forming method of the invention.

<Graft Polymer Generating Step>

The "graft polymer generating step" in the conductive pattern forming method of the invention is a step of contacting a radical-polymerizable unsaturated compound with the substrate which has carried out the "photocleavable compound bonding step", and exposing light thereto patternwise, so as to form a region where a graft polymer is generated and a region where a graft polymer is not generated.

For the details of the "graft polymer generating step", reference can be made to that in the aforementioned pattern forming method of the invention.

As the radical-polymerizable unsaturated compound to be used in the first embodiment of implementation of the conductive pattern forming method of the invention there is preferably used a hydrophilic polymer, macromer or monomer having a hydrophilic group as a polar group from the standpoint of adhesion/adsorption of metal ion or meal salt. As the radical-polymerizable unsaturated compound to be used in the second embodiment of implementation of the conductive pattern forming method of the invention there may be used a compound having a radical-polymerizable functional group and a functional group interacting with an electroless plating catalyst or precursor thereof. The functional group interacting with an electroless plating catalyst or precursor thereof in the radical-polymerizable unsaturated compound corresponds to a polar group.

In accordance with the aforementioned "photocleavable compound bonding step" and "graft polymer generating step", a fine pattern is formed according to the resolution of exposure composed of the region where the graft polymer is generated and the region where the graft polymer is not generated.

In accordance with the conductive pattern forming method of the invention, the formation of a region where a graft polymer is generated by the aforementioned "photocleavable compound bonding step" and "graft polymer-producing step" is followed by i) a step of providing a metal ion or metal salt to the region where the graft polymer is generated and then reducing the metal ion or metal ion in the metal salt to cause the metal to separate out (first embodiment), or ii) a step of providing an electroless plating catalyst or a precursor thereof to the region where the graft polymer is generated and then subjecting the substrate to electroless plating to form a thin metal layer (second embodiment), whereby a conductive pattern is formed. This conductive pattern forming method will be further described hereinafter.

In the first embodiment of implementation of the conductive pattern forming method of the invention, a step of providing a metal ion or a metal salt to the region where the graft polymer is generated (metal ion or metal salt providing step) and a step of reducing the metal ion or metal ion in the metal salt to cause the metal to separate out (metal (particle) layer forming step are effected to form a conductive pattern. In some detail, in the first embodiment, a metal ion or metal salt is adhered (adsorbed) to a functional group capable of attracting metal ion such as hydrophilic group or metal salt contained in the graft polymer according to the function thereof. Subsequently, the metal ion or the like which has been adsorbed is reduced to cause the precipitation of simple body of metal on the region where the graft polymer is generated. A thin metal layer or a metal particle adhered layer having metal particles dispersed therein is formed according to the form of precipitation.

In the first embodiment, the method of providing a metal ion or metal salt may be properly selected depending on the compound constituting the region where the graft polymer is generated. Further, the region where the graft polymer is generated is preferably a hydrophilic region from the standpoint of adhesion of metal ion or the like. In this case, the compound constituting the region where the graft polymer is generated is a hydrophilic compound.

In some detail, the method of providing a metal ion or metal salt may be properly selected from the group consisting of (1) a method which comprises allowing a metal ion to be adsorbed to the ionic group in a graft polymer if the graft polymer has an ionic group (polar group), (2) a method which comprises impregnating a region where a graft polymer is generated with a metal salt or a solution of metal salt if the graft polymer has a high affinity for metal salt like polyvinyl pyrrolidone and (3) a method which comprises dipping a region where the hydrophilic graft polymer is generated (hydrophilic region) in a solution containing a metal salt or a solution having a metal salt dissolved therein in order to impregnate the region with a solution containing metal ion and/or metal salt. In particular, in accordance with the method (3), the properties of the graft polymer are not specifically questioned, making it possible to provide a desired metal ion or metal salt to the region where the graft polymer is generated.

In the second embodiment of implementation of the conductive pattern forming method of the invention, a step of providing an electroless plating catalyst or precursor thereof to the region where the graft polymer is generated (interacting region) (electroless plating catalyst providing step) and a step of carrying out electroless plating to form a patterned thin metal layer (electroless plating step) are sequentially effected to form a conductive pattern.

That is, in the second embodiment, the graft polymer having a functional group (i.e., polar group) interacting with an electroless plating catalyst or a precursor thereof interacts with an electroless plating catalyst or a precursor thereof. Subsequently, electroless plating is carried out to form a thin metal layer.

As a result, a metal (particle) layer is formed. In the case where a thin metal layer (continuous layer) is formed, a region having a high electrical conductivity is particularly formed. Further, the region where the graft polymer is not generated doesn't have any metal ion, metal salt and electroless plating catalyst (precursor) adsorbed thereto or is not impregnated with any of these components. Thus, no metal (particle) layer is formed on the region where the graft polymer is not generated. In this manner, a nonconductive insulating region is formed.

The "metal ion or metal salt providing step" and "metal (particle) layer forming step" in the aforementioned first embodiment will be further described hereinafter.

<Metal Ion or Metal Salt Providing Step>

[Metal Ion and Metal Salt]

The metal ion and metal salt will be described hereinafter.

The metal salt to be used in the invention is not specifically limited so far as it can be dissolved in a proper solvent suitable for providing the metal salt to the region where the graft polymer is generated to dissociate into metal ion and base (anion). Examples of the metal salt employable herein include $M(NO_3)_n$, $MCl_n$, $M_{2/n}(SO_4)$, and $M_{3/n}(PO_4)$ (in which M represents a metal atom having a valence of n). As the metal ion there is preferably used one obtained by dissociation of the aforementioned metal salt. Specific examples of such a metal ion include Ag, Cu, Al, Ni, Co, Fe, and Pd. The conductive layer is preferably made of Ag. The magnetic layer is preferably made of Co.

[Method of Providing Metal Ion and Metal Salt]

In the case where the method (1) which comprises allowing a metal ion to be adsorbed to the ionic group in a graft polymer if the graft polymer has an ionic group is used to provide a metal ion or metal salt to the region where the graft polymer is generated, a solution containing dissociated metal ions obtained by dissolving the aforementioned metal salt in a proper solvent may be spread over the surface of a substrate having a region where a graft polymer is generated present thereon. Alternatively, the substrate having a region where a graft polymer is generated present thereon may be dipped in the solution. By bringing the solution containing metal ions into contact with the substrate, metal ions can be ionically adsorbed to the aforementioned ionic group. In order to fulfill this adsorption, the concentration of metal ion or metal salt in the solution to be brought into contact with the substrate is preferably from 1 to 50% by mass, more preferably from 10 to 30% by mass. The time during which the solution comes in contact with the substrate is preferably from about 10 seconds to 24 hours, more preferably from about 1 minute to 180 minutes.

In the case where the method (2), which comprises impregnating a region where a graft polymer is generated with a metal salt or a solution of metal salt if the graft polymer has a high affinity for metal salt like polyvinyl pyrrolidone, is used to provide a metal ion or metal salt to the region where the graft polymer is generated, the aforementioned metal salt may be directly adhered to the substrate in particulate form. Alternatively, a dispersion of the metal salt in a proper solvent capable of dispersing metal salt therein may be spread over the surface of the substrate having a region where a graft polymer is generated present thereon. Alternatively, the substrate having a region where a graft polymer is generated present thereon may be dipped in the dispersion. In the case where the graft polymer is made of a hydrophilic compound, the region where the graft polymer is generated has a high water retention. Accordingly, making the use of the high water retention, the region where the graft polymer is generated can be impregnated with the dispersion of metal salt. In order to fulfill the impregnation with the dispersion, the concentration of metal ion or metal salt in the dispersion to be brought into contact with the substrate is preferably from 1 to 50% by mass, more preferably from 10 to 30% by mass. The time during which the dispersion comes in contact with the substrate is preferably from about 10 seconds to 24 hours, more preferably from about 1 minute to 180 minutes.

In the case where the method (3), which comprises dipping a region where the hydrophilic graft polymer is generated (hydrophilic region) in a solution containing a metal salt or a solution having a metal salt dissolved therein to impregnate the region with a solution containing metal ion and/or metal salt, is used to provide a metal ion or metal salt to the region where the graft polymer is generated, a dispersion of the aforementioned metal salt in a proper solvent capable of dispersing the metal salt therein or a solution of dissociated metal ions obtained by dissolving the aforementioned metal salt in a proper solvent may be coated over the surface of the substrate having a region where the hydrophilic graft polymer is generated presents thereon. Alternatively, the substrate having the region where the graft polymer is generated present thereon may be dipped in the solution. In this method, too, making the use of the high water retention, the hydrophilic graft polymer-produced region can be impregnated with the dispersion or dispersion similarly to the aforementioned case. In order to fulfill the impregnation with the dispersion or solution, the concentration of metal ion or metal salt in the dispersion to be brought into contact with the substrate is preferably from 1 to 50% by mass, more preferably from 10 to 30% by mass. The time during which the dispersion comes in contact with the substrate is preferably from about 10 seconds to 24 hours, more preferably from about 1 minute to 180 minutes.

<Metal (Particle) Layer Forming Step>

[Reducing Agent]

In the invention, the reducing agent to be used to reduce the metal salt or metal ion adsorbed to or contained in the region where the graft polymer is generated (hydrophilic region) and form a metal (particle) layer is not specifically limited so far as it has such physical properties that the metal salt compound used can be reduced to cause the metal to separate out. Examples of the reducing agent employable herein include hypophosphites, tetrahydroborates, and hydrazine.

Such a reducing agent may be properly selected depending on the relationship with the metal salt or metal ion used. For example, if an aqueous solution of silver nitrate is used as an aqueous solution of metal salt for supplying metal ion or metal salt, sodium tetrahydroborate is preferably used. If an aqueous solution of palladium dichloride is used, hydrazine is preferably used.

Examples of the method of adding the aforementioned reducing agent include a method which comprises providing a metal ion or metal salt to the surface of the substrate having a region where a graft polymer is generated present thereon, washing the substrate with water to remove extra metal or metal ion, dipping the substrate provided with such a surface in water such as ion-exchanged water, and then adding a reducing agent to water, and a method which comprises directly spreading an aqueous solution of reducing agent having a predetermined concentration over the surface of the substrate or adding dropwise the aqueous solution of reducing agent to the surface of the substrate. The added amount of the reducing agent is preferably in excess at the equivalence point with metal ion, more preferably not smaller than 10 times the equivalent.

The presence of a uniform high strength metal (particle) layer developed by the addition of the reducing agent can be visually confirmed. However, the structure of the metal (particle) layer can be confirmed by observing the surface of the metal (particle) layer under transmission electron microscope or AFM (atomic force microscope). The thickness of the metal (particle) layer can be easily measured by any ordinary method such as method involving the observation of a section of the metal (particle) layer under electron microscope.

[Relationship Between the Polarity of Functional Group in the Graft Polymer and the Metal Ion or Metal Salt During Surface Graft Polymerization]

In the case where the graft polymer constituting the graft pattern has a functional group having a negative charge, a region where a simple body of metal (thin metal layer or metal particles) separates out is formed by allowing a metal ion having a positive charge to be adsorbed to the graft pattern, and then reducing the metal ion thus adsorbed to the graft pattern.

[Relationship Between the Polarity of Hydrophilic Compound-bound Hydrophilic Group and the Metal ion or Metal Salt]

In the case where the graft polymer constituting the graft pattern has an anionic group such as carboxyl group, sulfonic acid group and phosphonic acid group as a hydrophilic functional group as previously mentioned, the patterned area selectively has a negative charge. By allowing a metal ion having a positive charge to be adsorbed to the patterned area and then reducing the metal ion adsorbed to the patterned area, a metal (particle) layer region (e.g., wiring) is formed.

On the other hand, in the case where the graft polymer chain constituting the graft pattern has a cationic group such as ammonium group as disclosed in JP-A-10-296895, the patterned area selectively has a positive charge. By impregnating the patterned area with a solution containing a metal salt or a solution having a metal salt dissolved therein and then reducing the metal ion in the solution with which the patterned area has been impregnated or the metal ion in the metal salt, a metal (particle) layer region (e.g., wiring) is formed.

These metal ions are preferably bonded to the patterned area in the maximum amount such that they can be provided (adsorbed) to the hydrophilic group on the hydrophilic surface from the standpoint of durability.

Examples of the method of providing a metal ion to the hydrophilic group include a method which comprises spreading a solution or dispersion of a metal ion or metal salt over the surface of a support, and a method which comprises dipping the surface of the support in the solution or dispersion. In both the coating method and dipping method, the time during which the solution or dispersion comes in contact with the surface of the support is preferably from about 10 seconds to 24 hours, more preferably from about 1 minute to 180 minutes to supply excessive amount of metal ions so that sufficient ionic bonds to the hydrophilic group can be made.

The number of kinds of the aforementioned metal ions to be used herein is not only one but also plural as necessary. In order to obtain a desired electrical conductivity, a plurality of materials may be previously mixed.

The pattern formed according the invention can be confirmed to have metal particles dispersed compactly in the surface graft layer by observing the surface or section thereof under SEM or AFM. Referring to the size of the metal particles thus prepared, the particle diameter of the metal particles is from about 1 μm to 1 nm.

In the case where the conductive pattern prepared according to the aforementioned method has metal particles densely adsorbed thereto to form an apparently thin metal layer, the conductive pattern may be used as it is. However, in order to assure that the desired electrical conductivity can be efficiently provided, the pattern thus formed is preferably further subjected to heat treatment.

The heating temperature at the heat treatment step is preferably 100° C. or more, more preferably 150° C. or more, particularly about 200° C. The heating temperature is preferably 400° C. or less taking into account the treatment efficiency or the dimensional stability of the support. The heating time is preferably 10 minutes or more, more preferably from about 30 minutes to 60 minutes. The mechanism of action of heat treatment is not yet definite. However, it is thought that some adjacent metal particles are fused to each other to enhance the electrical conductivity of the conductive pattern.

The "electroless plating catalyst providing step" and "electroless plating step" in the second embodiment of implementation of the conductive pattern forming method of the invention will be described hereinafter.

<Electroless Plating Catalyst Providing Steps>

At the present step, an electroless plating catalyst or precursor thereof is provided to the interacting region formed at the aforementioned graft polymer generating step.

[Electroless Plating Catalyst]

The electroless plating catalyst to be used at the present step is mainly a metal having a valence of 0 such as Pd, Ag, Cu, Ni, Al, Fe and Co. In the invention, Pd and Ag are preferred because of their high handleability and catalytic activity. As the method of fixing the metal having a valence of 0 to the interacting region there may be used, e.g., a method which comprises applying to the interacting region a metal colloid having a charge adjusted to have interaction with the interacting group on the interacting region. In general, a metal colloid can be prepared by reducing metal ions in a solution having a surface active agent or protective agent having a charge present therein. The charge of the metal colloid can be adjusted by the surface active agent or protective agent used herein. By allowing the metal colloid having a charge thus adjusted to interact with the interacting group contained in the graft pattern, the metal colloid (electroless plating catalyst) can be selectively adsorbed to the graft pattern.

[Electroless Plating Catalyst Precursor]

The electroless plating catalyst precursor to be used at the present step is not specifically limited so far as it can form an electroless plating catalyst when subjected to chemical reaction. The ion of metal having a valence of 0 as used in the aforementioned electroless plating may be mainly used. The metal ion which is an electroless plating catalyst precursor becomes a metal having a valence of 0 which is an electroless plating catalyst when subjected to reduction reaction. After being provided to the substrate, the metal ion which is an electroless plating catalyst precursor may be subjected to separate reduction reaction before being dipped in the electroless plating bath so that it is converted to a metal having a valence of 0 which is an electroless plating catalyst or may be dipped as it is in the electroless plating bath where it is converted to a metal (electroless plating catalyst) by the reducing agent contained therein.

In actuality, the metal ion which is an electroless plating catalyst precursor is provided to the graft pattern in the form of metal salt. The metal salt to be used herein is not specifically limited so far as it can be dissolved in a proper solvent to dissociate into metal ion and base (anion). Examples of the metal salt employable herein include $M(NO_3)_n$, $MCl_n$, $M_{2/n}(SO_4)$, and $M_{3/n}(PO_4)$ (in which M represents a metal atom having a valence of n). As the metal ion there is preferably used one obtained by dissociation of the aforementioned metal salt. Specific examples of such a metal ion include Ag ion, Cu ion, Al ion, Ni ion, Co ion, Fe ion, and Pd ion. Preferred among these metal ions are Ag ion and Pd ion from the standpoint of catalytic activity.

In order to provide a metal colloid which is an electroless plating catalyst or a metal salt which is an electroless plating catalyst, precursor to the graft pattern, a solution of dissociated metal ions obtained by dispersing or dissolving a metal colloid in a proper dispersant or solvent may be spread over the surface of the substrate having a graft pattern present thereon. Alternatively, the substrate having a graft pattern present thereon may be dipped in the solution. By allowing a solution containing metal ions to come in contact with the substrate, the metal ions can be adsorbed to the interacting group on the interacting region or the interacting region can be impregnated with the metal ions by making the use of ion-ion interaction or dipole-ion interaction. In order to fulfill this adsorption or impregnation, the concentration of metal ion or metal salt in the solution to be brought into contact with the substrate is preferably from 0.01 to 50% by mass, more preferably from 0.1 to 30% by mass. The time during which the dispersion comes in contact with the substrate is preferably from about 1 minute to 24 hours, more preferably from about 5 minutes to 1 hour.

<Electroless Plating Step>

At the present step, the substrate which has been provided an electroless plating catalyst or precursor thereof on the interacting region is subjected to electroless plating to form a patterned metal layer. In other words, when electroless plating is effected at the present step, a high density metal layer (metal pattern) is formed on the graft pattern obtained at the aforementioned step according to the pattern thus formed. The metal pattern thus formed has an excellent electrical conductivity and adhesion.

[Electroless Plating]

Electroless plating is a procedure involving the precipitation of metal by chemical reaction using a solution containing a metal ion to be precipitated as a plating metal.

At the present step, electroless plating is carried out, e.g., by washing a substrate having a patterned electroless plating catalyst provided thereon with water to remove extra electroless plating catalyst (metal), and then dipping the substrate in an electroless plating bath. As the electroless plating bath to be used herein there may be used any known electroless plating bath.

In order to dip the substrate having a patterned electroless plating catalyst precursor provided thereon in the electroless plating bath while the electroless plating catalyst precursor is being adsorbed to or incorporated in the graft pattern, the substrate is washed with water to remove extra precursor (metal salt or the like), and then dipped in the electroless plating bath. In this case, the reduction of the precursor and subsequent electroless plating are effected in the electroless plating bath. As the electroless plating bath to be used herein, too, there may be used any known electroless plating bath.

Referring to the formulation of ordinary electroless plating bath, the main constituents are 1. plating metal ion, 2. reducing agent and 3. additives (stabilizer) for enhancing the stability of metal ion. This plating bath may comprise known additives such as plating bath stabilizer incorporated therein besides these constituents.

As the kinds of the metal to be incorporated in the electroless plating bath there have been known copper, tin, lead, nickel, gold, palladium and rhodium. Particularly preferred among these metals are copper and gold from the standpoint of electrical conductivity.

There are reducing agents and additives suitable for the aforementioned metals. For example, an electroless copper plating bath contains $Cu(SO_4)_2$ as a copper salt, HCOH as a reducing agent and a chelating agent such as EDTA and Rochelle salt, which are copper ion stabilizers, as an additive. The plating bath for use in electroless plating of CoNiP contains cobalt sulfate and nickel sulfate as metal salt, sodium hypophosphite as a reducing agent and sodium malonate, sodium malate and sodium succinate as complexing agent. An electroless palladium plating bath contains $(Pd(NH_3)_4)Cl_2$ as a metal ion, $NH_3$ and $H_2NNH_2$ as reducing agent and EDTA as a stabilizer. These plating baths may contain components other than the aforementioned components.

The thickness of the metal layer thus formed can be controlled by predetermining the concentration of metal salt or metal ion in the plating bath, the time of dipping in the plating bath or the plating bath temperature but is preferably 0.5 μm or more, more preferably 3 μm or more from the standpoint of electrical conductivity. The time of dipping in the plating bath is preferably from about 1 minute to 3 hours, more preferably from about 1 minute to 1 hour.

The metal layer portion of the metal pattern thus obtained was confirmed to have electroless plating catalyst or plating metal particles dispersed compactly in the surface graft layer and relatively great particles deposited thereon when observed sectionally under SEM. The interface of the metal layer portion is composed of graft polymer and fine particles in hybrid state. Accordingly, even if the difference in height between fallen portion and raised portion on the interface of substrate (organic component) with inorganic material (electroless plating catalyst or plating metal) was 100 nm or less, the metal pattern exhibited a good adhesion.

<Electroplating Step>

In the second embodiment of implementation of the conductive pattern forming method of the invention, the aforementioned electroless plating step may be followed by a step of effecting electroplating (electroplating step).

At the present step, electroplating may be effected with the metal layer formed at the aforementioned electroless plating step as an electrode. In this manner, another metal layer can be easily formed the metal pattern (conductive pattern) having an excellent adhesion to the substrate to an arbitrary thickness with this metal pattern as a base. The addition of this step makes it possible to form a patterned metal layer to a thickness according to the purpose and thus is suitable for the adaptation of the conductive pattern of the invention to various applications such as wiring pattern.

As the electroplating method there may be used any of known electroplating methods. Examples of the metal to be used at the present electroplating step include copper, chromium, lead, nickel, gold, silver, tin, and zinc. Preferred among these metals are copper, gold and silver from the standpoint of electrical conductivity. More desirable among these metals is copper.

The thickness of the metal layer obtained at the electroplating step depends on the purpose and can be controlled by properly adjusting the concentration of metal in the plating bath, the dipping time or the current density. The thickness of the metal layer in the case where the conductive pattern is used in ordinary electrical wiring is preferably 0.3 μm or more, more preferably 3 μm or more from the standpoint of electrical conductivity.

2. Conductive Pattern Material

The conductive pattern material of the invention is obtained by the aforementioned conductive pattern forming method of the invention.

The conductive pattern material of the invention has a highly fine and durable high density metal (particle) pattern formed on the surface of a substrate. This metal (particle) pattern can be formed at a simple step. This conductive pattern material of the invention can be expected to find wide application to high density magnetic disc, magnetic head, magnetic tape, magnetic sheet, magnetic disc, etc. The conductive pattern material of the invention can be used also to form various circuits. By properly selecting pattern forming means, the conductive pattern material can form a fine conductive region. Thus, the conductive pattern material of the invention can be expected to find wide application, including the formation of circuits such as micromachine and super LSI.

In the case where as the substrate there is used a transparent film such as PET, the conductive pattern material of the invention can be used as a transparent patterned conductive film. Examples of the usage of such a transparent conductive film include transparent electrodes for display, light shielding devices, solar cells, touch panels, and other transparent conductive films. However, the transparent conductive film is useful particularly as an electromagnetic wave shield filter to be attached to CRT or plasma display. Such an electromagnetic wave shield filter needs to have a high electrical conductivity and transparency and thus is preferably provided with a metal (article) layer in lattice form. The lattice lines preferably have a width of from 20 to 100 μm and the gap between the lattice lines is preferably from about 50 to 600 μm. This lattice may not be necessarily formed regularly by a straight line but may be formed by a curve.

In the invention, a finer pattern having a line width of 10 μm or less can be formed. Thus, the invention can easily form a metal wiring or metal particle adhered layer having an arbitrary pattern form, allowing various predeterminations according to the purpose.

The conductive pattern forming method obtained according to the invention is capable of forming a fine pattern having a high electrical conductivity. The conductive pattern material (metal particle pattern material) obtained according to the invention can have metal particles dispersed densely therein in such an arrangement that a metal particle-dispersed layer having an excellent durability is formed in a desired fine pattern and thus can find wide application to materials having a high electrical conductivity and arbitrary pattern such as metal wiring material and electromagnetic wave shield, including materials for forming circuits such as micromachine and super LSI, electromagnetic wave shields to be attached to CRT or plasma display, transparent electrodes for display, light shielding devices, solar cells, touch panels, other transparent conductive films, high density magnetic discs, magnetic heads, magnetic tapes, magnetic sheets, magnetic discs, and other magnetic materials.

EXAMPLES

The invention will be further described hereinafter in the following examples, but the invention is not construed as being limited thereto.

Synthesis Example 1

Synthesis of Compound a

The synthesis of the aforementioned exemplary compound 1 is effected by the following two steps. The scheme of these steps will be described below.

1. Step 1 (Synthesis of Compound a)

24.5 g (0.12 mol) of 1-hydroxycyclohexylphenyl ketone was dissolved in a mixture of 50 g of DMAx and 50 g of THF. To the solution was then gradually added 7.2 g (0.18 mol) of NaH (60% in oil) over ice bath. To the mixture was then added dropwise 44.2 g (0.18 mol) of 11-bromo-1-undecene (95%). The mixture was then reacted at room temperature. The reaction was terminated in 1 hour. The reaction solution was then poured into ice water. The reaction was then extracted with ethyl acetate to obtain a mixture containing Compound a in the form of yellow solution. 37 g of the mixture thus obtained was then dissolved in 370 ml of acetonitrile. To the solution was then added 7.4 g of water. To the mixture was then added 1.85 g of p-toluenesulfonic acid monohydrate. The mixture was then stirred at room temperature for 20 minutes. The resulting organic phase was then extracted with ethyl acetate. The solvent was then distilled off. The residue was then subjected to column chromatography (filler: Wakogel C-200; developing solvent: 1:80 mixture of ethyl acetate and hexane) to isolate Compound a.

The synthesis scheme will be given below.

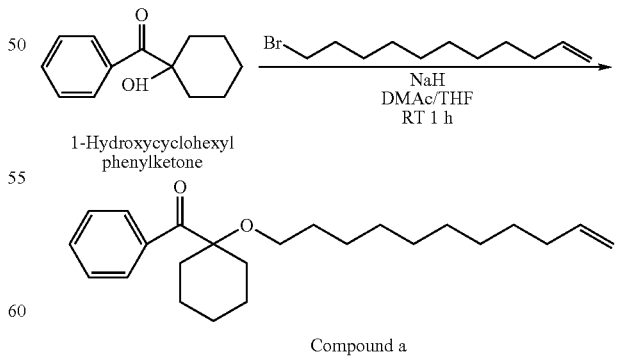

Compound a $^1$H NMR (300 MHz CDCl$_3$) δ=1.2-1.8 (mb, 24H), 2.0 (q, 2H), 3.2 (t, J=6.6, 2H), 4.9-5.0 (m, 2H), 5.8 (ddt, J=24.4, J=10.5, J=6.6, 1H), 7.4 (t, 3=7.4, 2H), 7.5 (t, J=7.4, 1H), 8.3 (d, 1H)

2. Step 2 (Synthesis of Compound A by Hydrosilylation of Compound a)

To 5.0 g (0.014 mol) of Compound a were added two droplets of Speir catalyst ($H_2PtCl_6 \cdot 6H_2O$/2-PrOH, 0.1 mol/l). To the mixture was then added dropwise 2.8 g (0.021 mol) of trichlorosilane over ice bath. The mixture was then stirred. After 1 hour, to the mixture was added dropwise 1.6 g (0.012 mol) of trichlorosilane. The temperature of the mixture was then returned to room temperature. After 3 hours, the reaction was terminated. After the termination of the reaction, unreacted trichlorosilane was distilled off under reduced pressure to obtain Compound A.

The synthesis scheme will be given below.

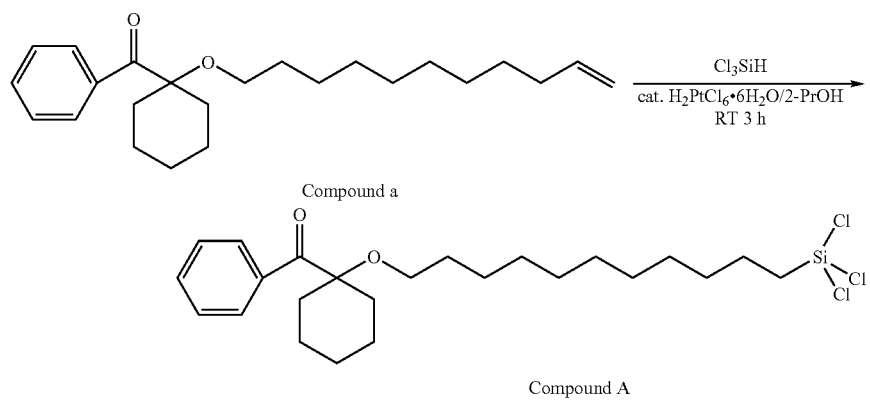

$^1$H NMR (300 MHz $CDCl_3$) δ=1.2-1.8 (m, 30I), 3.2 (t, J=6.3, 2H), 7.3-7.7 (m, 3H), 8.3 (d, 2H)

Synthesis Example 2

Synthesis of Hydrophilic Polymer P Having Polymerizable Group 18 g of a polyacrylic acid (average molecular weight: 25,000) was dissolved in 300 g of DMAc (dimethyl acetamide). To the solution were then added 0.41 g of hydroquinone, 19.4 g of 2-methacryloyloxyethyl isocyanate and 0.25 g of dibutyl dilaurate. The reaction mixture was then reacted at 65° C. for 4 hours. The resulting polymer exhibited an acid value of 7.02 meq/g. The carboxyl group was then neutralized with 1 mol/l of an aqueous solution of sodium hydroxide. The reaction solution was then added to ethyl acetate to cause the precipitation of a polymer which was then thoroughly washed to obtain a hydrophilic polymer P having a polymerizable group.

Examples 1 to 3 will be given below as examples of the pattern forming method of the invention, but the invention is not limited thereto.

Example 1

Photocleavable Compound Bonding Step

A glass substrate (produced by Nippon Sheet Glass Co., Ltd.) was dipped in piranha solution (1:1 (by volume) mixture of sulfuric acid and 30% hydrogen peroxide) overnight, and then cleaned with purified water. The substrate thus treated was put in a separable flask in which the air within had been replaced by nitrogen, and then dipped in a dehydrated toluene solution of 12.5 wt-% of Compound A for 1 hour. The substrate was withdrawn from the solution, and then washed sequentially with toluene, acetone and purified water. Thus, a substrate A1 was obtained.

(Graft Polymer Generating Step)

0.5 g of the hydrophilic polymer P was dissolved in a mixture of 4.0 g of purified water and 2.0 g of acetonitrile to prepare a graft-forming layer coating solution. The graft-forming layer coating solution thus prepared was then spread over the substrate A1 using a spin coater. In some detail, the spin coater was operated at 300 rpm for 5 seconds and then at 1,000 rpm for 20 seconds. The substrate A1 having a graft-forming layer coating solution spread thereover was then dried at 100° C. for 2 minutes. The thickness of the graft-forming layer thus dried was 2 μm.

—Patternwise Exposure—

Using a Type UVX-02516S1LP01 exposing machine (produced by USHIO INC.), the substrate having a graft-forming layer coating solution spread thereover was then exposed to light for 1 minute with a Type NC-1 pattern mask (produced by TOPPAN PRINTING CO., LTD.) fixed to the substrate with a clip in such an arrangement that it came in close contact therewith. The substrate thus exposed was freed of the mask, and then thoroughly washed with purified water.

Thus, a pattern A1 (a region where a graft polymer is generated, and a region where a graft polymer is not generated) was formed.

Example 2

(Photocleavable Compound Bonding Step)

A glass substrate (produced by Nippon Sheet Glass Co., Ltd.; surface resistance: 10 Ω/sq; model No.: 49J183) vacuum-metallized with ITO was subjected to ultrasonic cleaning sequentially with isopropyl alcohol, acetone, methanol and purified water for 5 minutes or more, respectively, and then dried by blowing nitrogen thereagainst. The substrate thus treated was put in a separable flask in which the air within had been replaced by nitrogen, and then dipped in a dehydrated toluene solution of 12.5 wt-% of Compound a for 1 hour to overnight. The substrate was withdrawn from the solution, and then washed sequentially with toluene, acetone and purified water. Thus, a substrate A2 was obtained.

(Graft Polymer Generating Step)

A graft-forming layer coating solution was spread over the substrate A2, and then dried in the same manner as in Example 1. The graft-forming layer thus dried had a thickness of 2 μm.

—Patternwise Exposure—

The substrate was subjected to patternwise exposure with a pattern mask in the same manner as in Example 1. The substrate thus exposed was freed of mask, and then thoroughly washed with purified water.

Thus, a pattern A2 (a region where a graft polymer is generated, and a region where a graft polymer is not generated) was formed.

Example 3

(Photocleavable Compound Bonding Step)

PET (biaxially-stretched polyethylene terephthalate film) having a thickness of 188 μm which had been corona-treated on one side thereof was cut into a size of 5 cm×5 cm. The substrate was put in a separable flask in which the air within had been replaced by nitrogen, and then dipped in a dehydrated toluene solution of 12.5 wt-% of Compound A for 1 hour to overnight. The substrate was withdrawn from the solution, and then washed sequentially with toluene, acetone and purified water. Thus, a substrate A3 was obtained.

(Graft Polymer Generating Step)

1.0 ml of a 20 wt-% aqueous solution of acrylic acid was dropped onto the surface of the substrate A3. A sheet of quartz glass was put on the PET substrate (substrate A3) so that the aqueous solution of acrylic acid was disposed interposed between the sheet of quartz and the PET substrate.

—Patternwise Exposure—

The substrate was subjected to patternwise exposure with a pattern mask in the same manner as in Example 1. The substrate thus exposed was freed of mask, and then thoroughly washed with purified water.

Thus, a pattern A3 (a region where a graft polymer is generated, and a region where a graft polymer is not generated) was formed.

<Confirmation and Evaluation of Pattern>

The patterns A1 to A3 obtained in Examples 1 to 3 were each confirmed for pattern by the following confirming methods (1) and (2).

Confirming Method (1):

The patterns formed on the substrates A1 to A3 were each observed under atomic force microscope AFM (Nanopics 1000, produced by Seiko Instruments Inc.; DFM cantilever used). The line width of the minimum line-and-space which was able to be analyzed is set forth in Table 1 below.

Confirming Method (2):

The substrates A1 to A3 were each dipped in a 0.1 wt-% aqueous solution of methylene blue for 5 minutes, and then washed with purified water. Thereafter, the various patterns were each confirmed under optical microscope. The line width of the minimum line-and-space which was able to be analyzed is set forth in Table 1 below.

TABLE 1

|  | Pattern | Confirming method (1) (μm) | Confirming method (2) (μm) |
|---|---|---|---|
| Example 1 | A1 | 5 | 5 |
| Example 2 | A2 | 6 | 6 |
| Example 3 | A3 | 5 | 6 |

As can be seen in the results of Table 1, Examples 1 to 3, in which patterns were formed according to the pattern forming method of the invention, allowed easy formation of a fine graft polymer pattern.

Examples 4 to 9 will be given below as examples of the arranged fine particle pattern forming method of the invention, but the invention is not construed as being limited thereto.

Example 4

(Photocleavable Compound Bonding Step)

A glass substrate (produced by Nippon Sheet Glass Co., Ltd.) was dipped in piranha solution (1:1 (by volume) mixture of sulfuric acid and 30% hydrogen peroxide) overnight, and then cleaned with purified water. The substrate thus treated was put in a separable flask in which the air within had been replaced by nitrogen, and then dipped in a dehydrated toluene solution of 12.5 wt-% of Compound a for 1 hour. The substrate was withdrawn from the solution, and then washed sequentially with toluene, acetone and purified water. Thus, a substrate B1 was obtained.

(Graft Polymer Generating Step)

0.5 g of the hydrophilic polymer P was dissolved in a mixture of 4.0 g of purified water and 2.0 g of acetonitrile to prepare a graft-forming layer coating solution. The graft-forming layer coating solution thus prepared was then spread over the substrate B1 using a spin coater. In some detail, the spin coater was operated at 300 rpm for 5 seconds and then at 1,000 μm for 20 seconds. The substrate B1 having a graft-forming layer coating solution spread thereover was then dried at 100° C. for 2 minutes. The thickness of the graft-forming layer thus dried was 2 μm.

—Patternwise Exposure—

Using a Type UVX-02516S1LP01 exposing machine (produced by USHIO INC.), the substrate having a graft-forming layer coating solution spread thereover was then exposed to light for 1 minute with a Type NC-1 pattern mask (produced by TOPPAN PRINTING CO., LTD.) fixed to the substrate with a clip in such an arrangement that it came in close contact therewith. The substrate thus exposed was freed of the mask, and then thoroughly washed with purified water.

Thus, a pattern B1 was formed.

—Confirmation of Pattern—

The pattern B1 was observed under atomic force microscope AFM (Nanopics 1000, produced by Seiko Instruments Inc.; DFM cantilever used). As a result, the pattern B1 was confined to have a pattern (a region where a graft polymer is generated) having a width of 9 μm formed thereon.

(Particle Adhering Step)

The substrate having the pattern B1 (acrylic acid graft pattern) was dipped in an aqueous dispersion of particulate $TiO_2$ (1.5 wt-%; produced by C.I.KASEI.CO., LTD.) having a positive charge for 1 hour, withdrawn, thoroughly washed with water, and then dried to obtain an arranged fine particle pattern material 1.

The surface of the arranged fine particle pattern material 1 thus obtained was then observed at 50,000× magnification under a Type S800 scanning electron microscope (produced by JEOL). As a result, the pattern was found to have particulate $TiO_2$ accumulated thereon. The resolution of the pattern was 9 μm as calculated in terms of width. It was also found that little particles had been adhered to areas other than the region where the graft polymer is generated, demonstrating that selective adsorption of functional particles bad been effected to attain an excellent resolution.

(Evaluation of Durability)

The arranged fine particle pattern material 1 thus obtained was rubbed with cloth 50 times in water, and then observed under electron microscope. As a result, the same sharp pattern as observed before rubbing with cloth was confirmed, demonstrating that the pattern form cannot be damaged by rubbing and the adhesion of particles is strong.

The particulate $TiO_2$ was then measured for zeta potential using Zetasizer 2000 (produced by Malvern Instruments Inc.). As a result, the zeta potential of the particulate $TiO_2$ was found to be +42 mV, demonstrating that the $TiO_2$ had a positive charge.

Example 5

(Photocleavable Compound Bonding Step)

A glass substrate (produced by Nippon Sheet Glass Co., Ltd.; surface resistance: Ω/sq; model No.: 49J183) vacuum-metallized with ITO was subjected to ultrasonic cleaning sequentially with isopropyl alcohol, acetone, methanol and purified water for 5 minutes or more, respectively, and then dried by blowing nitrogen thereagainst. The substrate thus treated was put in a separable flask in which the air within had been replaced by nitrogen, and then dipped in a dehydrated toluene solution of 12.5 wt-% of Compound a for 1 hour to overnight. The substrate was withdrawn from the solution, and then washed sequentially with toluene, acetone and purified water. Thus, a substrate B2 having Compound a bonded thereto was obtained.

(Graft Polymer Generating Step)

A graft-forming layer coating solution was spread over the substrate B2, and then dried in the same manner as in Example 4. The graft-forming layer thus dried had a thickness of 2 μm.

—Patternwise Exposure—

The substrate was subjected to patternwise exposure with a pattern mask in the same manner as in Example 4. The substrate thus exposed was freed of mask, and then thoroughly washed with purified water.

Thus, a pattern B2 was formed.

—Confirmation of Pattern—

The pattern B2 was observed under atomic force microscope AFM (Nanopics 1000, produced by Seiko Instruments Inc.; DFM cantilever used). As a result, the pattern B2 was confirmed to have a pattern (graft polymer-produced region) having a width of 8 μm formed thereon.

(Particle Adhering Step)

The substrate having the pattern B2 was dipped in an aqueous dispersion of particulate $TiO_2$ having a positive charge, washed with water, and then dried in the same manner as in Example 4 to obtain an arranged fine particle pattern material 2.

The arranged fine particle pattern material 2 thus obtained was then observed in the same manner as in Example 4. As a result, the pattern was found to have particulate $TiO_2$ accumulated thereon. The resolution of the pattern was 9 μm as calculated in terms of width. It was also found that little particles had been adhered to areas other than the region where the graft polymer is generated, demonstrating that selective adsorption of functional particles had been effected to attain an excellent resolution.

(Evaluation of Durability)

The arranged fine particle pattern material 2 thus obtained was washed in the same manner as in Example 4, and then observed under electron microscope. As a result, the same sharp pattern as observed before rubbing with cloth was confirmed, demonstrating that the pattern form cannot be damaged by rubbing and the adhesion of particles is strong.

Example 6

(Photocleavable Compound Bonding Step)

PET (biaxially-stretched polyethylene terephthalate film) having a thickness of 188 μm which had been corona-treated on one side thereof was cut into a size of 5 cm×5 cm. The substrate was put in a separable flask in which the air within bad been replaced by nitrogen, and then dipped in a dehydrated toluene solution of 12.5 wt-% of Compound A for 1 hour to overnight. The substrate was withdrawn from the solution, and then washed sequentially with toluene, acetone and purified water. Thus, a substrate B3 having Compound a bonded thereto was obtained.

(Graft Polymer Generating Step)

1.0 ml of a 20 wt-% aqueous solution of acrylic acid was dropped onto the surface of the substrate B3. A sheet of quartz glass was put on the PET substrate (substrate B3) so that the aqueous solution of acrylic acid was disposed interposed between the sheet of quartz and the PET substrate.

—Patternwise Exposure—

The substrate was subjected to patternwise exposure with a pattern mask in the same manner as in Example 4. The substrate thus exposed was freed of mask, and then thoroughly washed with purified water.

Thus, a pattern B3 was formed.

—Confirmation of Pattern—

The pattern B3 was observed under atomic force microscope AFM (Nanopics 1000, produced by Seiko Instruments Inc.; DFM cantilever used). As a result, the pattern B3 was confirmed to have a pattern (graft polymer-produced region) having a width of 10 μm formed thereon.

(Particle Adhering Step)

The substrate having the pattern B3 was dipped in an aqueous dispersion of particulate $TiO_2$ having a positive charge, washed with water, and then dried in the same manner as in Example 4 to obtain an arranged fine particle pattern material 3.

The arranged fine particle pattern material 3 thus obtained was then observed in the same manner as in Example 4. As a result, the pattern was found to have particulate $TiO_2$ accumulated thereon. The resolution of the pattern was 9 μm as calculated in terms of width. It was also found that little particles had been adhered to areas other than the region where the graft polymer is generated, demonstrating that selective adsorption of functional particles had been effected to attain an excellent resolution.

(Evaluation of Durability)

The arranged fine particle pattern material 3 thus obtained was washed in the same manner as in Example 4, and then observed under electron microscope. As a result, the same sharp pattern as observed before rubbing with cloth was confirmed, demonstrating that the pattern form cannot be damaged by rubbing and the adhesion of particles is strong.

Examples 7-9

The procedure of Examples 4 to 6 were followed except that the aqueous dispersion of particulate $TiO_2$ having a positive charge to be used at the particle adhering step was replaced by a 1.5 wt-% aqueous dispersion of particulate $Al_2O_3$ (produced by C.I.KASEI.CO., LTD.), respectively. Thus, arranged fine particle pattern materials 7 to 9 of Examples 7 to 9, respectively, were prepared.

The arranged fine particle pattern materials 7 to 9 thus obtained were each observed for accumulation of particles under scanning electron microscope. As a result, it was observed that a sharp functional pattern having particulate $Al_2O_3$ adsorbed thereto had been formed. The resolution of the arranged fine particle pattern materials 7 to 9 were found to be 9 μm, 8 μm and 9 μm, respectively, as calculated in terms of width.

The arranged fine particle pattern materials 7 to 9 were each rubbed and washed in the same manner as in Example 4, and then observed under electron microscope. As a result, the same sharp pattern as observed before washing was confirmed, demonstrating that the pattern form cannot be damaged by cleaning and the adhesion of particles is strong.

The particulate $Al_2O_3$ was measured for zeta potential in the same manner as in Example 4. The result was +77 mV, demonstrating that the $Al_2O_3$ has a positive charge.

Examples 10 to 15 will be given below as examples of the conductive pattern forming method and conductive pattern material of the invention, but the invention is not construed as being limited thereto.

Example 10

(Photocleavable Compound Bonding Step)

A glass substrate (produced by Nippon Sheet Glass Co., Ltd.) was dipped in piranha solution (1:1 (by volume) mixture of sulfuric acid and 30% hydrogen peroxide) overnight, and then cleaned with purified water. The substrate thus treated was put in a separable flask in which the air within had been replaced by nitrogen, and then dipped in a dehydrated toluene solution of 12.5 wt-% of Compound A for 1 hour. The substrate was withdrawn from the solution, and then washed sequentially with toluene, acetone and purified water. Thus, a substrate C1 was obtained.

(Graft Polymer Generating Step)

0.5 g of the hydrophilic polymer P was dissolved in a mixture of 4.0 g of purified water and 2.0 g of acetonitrile to prepare a graft-forming layer coating solution. The graft-forming layer coating solution thus prepared was then coated over the substrate C1 using a spin coater. In some detail, the spin coater was operated at 300 rpm for 5 seconds and then at 1,000 rpm for 20 seconds. The substrate C1 having a graft-forming layer coating solution spread thereover was then dried at 100° C. for 2 minutes. The thickness of the graft-forming layer thus dried was 2 μm.

—Patternwise Exposure—

Using a Type UVX-02516S1LP01 exposing machine (produced by USHIO INC.), the substrate having a graft-forming layer coating solution spread thereover was then exposed to light for 1 minute with a Type NC-1 pattern mask (produced by TOPPAN PRINTING CO., LTD.) fixed to the substrate with a clip in such an arrangement that it came in close contact therewith. The substrate thus exposed was freed of the mask, and then thoroughly washed with purified water.

Thus, a pattern C1 (a region where a graft polymer is generated, and a region where a graft polymer is not generated) was formed.

The pattern C1 thus obtained was observed under atomic force microscope AFM (Nanopics 1000, produced by Seiko Instruments Inc.; DFM cantilever used). As a result, the pattern C1 was confirmed to have a pattern (a region where a graft polymer is generated) having a line having a width of 8 μm and a gap having a width of 8 μm alternatingly arranged thereon.

(Formation of Metal (Particle) Layer)

The substrate having the pattern C1 formed thereon was dipped in a 15 wt-% aqueous solution of silver nitrate (produced by Wako Pure Chemical Industries, Ltd.) for 12 hours, and then washed with distilled water. Thereafter, the substrate was dipped in 100 ml of distilled water to which 30 ml of 0.2 mold sodium tetrahydroborate was then added dropwise so that the silver ion adsorbed to the substrate was reduced. As a result, a uniform silver layer (metal (particle) layer) was formed on the surface of the pattern C1. The silver layer thus formed had a thickness of 0.1 μm. In this manner, a conductive pattern material 1 having a silver (particle) layer formed thereon was obtained.

The surface of the conductive pattern material 1 was then observed under electron microscope. As a result, it was confirmed that a good conductive pattern having a line having a width of 8 μm and a gap having a width of 8 μm alternatingly arranged thereon had been formed.

Example 11

(Photocleavable Compound Bonding Step)

A glass substrate (produced by Nippon Sheet Glass Co., Ltd.; surface resistance: 10 Ω/sq; model No.: 49J183) vacuum-metallized with ITO was subjected to ultrasonic cleaning sequentially with isopropyl alcohol, acetone, methanol and purified water for 5 minutes or more, respectively, and then dried by blowing nitrogen thereagainst. The substrate thus treated was put in a separable flask in which the air within had been replaced by nitrogen, and then dipped in a dehydrated toluene solution of 12.5 wt-% of Compound A for 1 hour to overnight. The substrate was withdrawn from the solution, and then washed sequentially with toluene, acetone and purified water. Thus, a substrate C2 was obtained.

(Graft Polymer Generating Step)

A graft-forming layer coating solution was spread over the substrate C2, and then dried in the same manner as in Example 10. The graft-forming layer thus dried had a thickness of 2 μm.

—Patternwise Exposure—

The substrate was subjected to patternwise exposure with a pattern mask in the same manner as in Example 10. The substrate thus exposed was freed of mask, and then thoroughly washed with purified water.

Thus, a pattern C2 (a region where a graft polymer is generated, and a region where a graft polymer is not generated) was formed.

The pattern C2 thus obtained was observed under atomic force microscope AFM (Nanopics 1000, produced by Seiko Instruments Inc.; DFM cantilever used). As a result, the pattern C2 was confirmed to have a pattern having a line having a width of 8 μm and a gap having a width of 8 μm alternatingly arranged thereon.

(Metal (Particle) Layer)

The substrate having the pattern C2 formed thereon was treated in the same manner as in Example 10. As a result, a uniform silver layer (metal (particle) layer) was formed on the surface of the pattern C2. The silver layer thus formed had a thickness of 0.1 μm. In this manner, a conductive pattern material 2 having a silver (particle) layer formed thereon was obtained.

The surface of the conductive pattern material 2 was then observed under electron microscope. As a result, it was confirmed that a good conductive pattern having a line having a width of 8 μm and a gap having a width of 8 μm alternatingly arranged thereon had been formed.

Example 12

(Photocleavable Compound Bonding Step)

PET (biaxially-stretched polyethylene terephthalate film) having a thickness of 188 μm which had been corona-treated on one side thereof was cut into a size of 5 cm×5 cm. The substrate was put in a separable flask in which the air within had been replaced by nitrogen, and then dipped in a dehydrated toluene solution of 12.5 wt-% of Compound A for 1 hour to overnight. The substrate was withdrawn from the solution, and then washed sequentially with toluene, acetone and purified water. Thus, a substrate C3 was obtained.

(Graft Polymer Generating Step)

1.0 ml of a 20 wt-% aqueous solution of acrylic acid was dropped onto the surface of the substrate C3. A sheet of quartz glass was put on the PET substrate (substrate C3) so that the aqueous solution of acrylic acid was disposed interposed between the sheet of quartz and the PET substrate.

—Patternwise Exposure—

The substrate was subjected to patternwise exposure with a pattern mask in the same manner as in Example 10. The substrate thus exposed was freed of mask, and then thoroughly washed with purified water.

Thus, a pattern C3 (a region where a graft polymer is generated, and a region where a graft polymer is not generated) was formed.

The pattern C3 thus obtained was observed under atomic force microscope AFM (Nanopics 1000, produced by Seiko Instruments Inc.; DFM cantilever used). As a result, the pattern C3 was confirmed to have a pattern having a line having a width of 7 μm and a gap having a width of 7 μm alternatingly arranged thereon.

(Metal (Particle) Layer)

The substrate having the pattern C3 formed thereon was treated in the same manner as in Example 1. As a result, a uniform silver layer (metal (particle) layer) was formed on the surface of the pattern C3. The silver layer thus formed had a thickness of 0.1 μm. In this manner, a conductive pattern material 3 having a silver (particle) layer formed thereon was obtained.

The surface of the conductive pattern material 3 was then observed under electron microscope. As a result, it was confirmed that a good conductive pattern having a line having a width of 8 μm and a gap having a width of 8 μm alternatingly arranged thereon had been formed.

<Evaluation of Electrical Conductivity>

The conductive pattern materials 1, 2 and 3 having a silver (particle) layer formed thereon thus obtained were each then measured for surface conductivity at the area on which the conductive pattern had been formed by a four-probe method using LORESTA-FP (produced by Mitsubishi Chemical Corporation). The following results were obtained.

Conductive pattern material 1: 100 Ω/sq
Conductive pattern material 2: 90 Ω/sq
Conductive pattern material 3: 80 Ω/sq <Evaluation of Thin Metal Layer>

1. Layer Strength (Adhesion)

The conductive pattern materials 1, 2 and 3 having a silver (particle) layer formed thereon thus obtained were each then evaluated for layer adhesion by a checkerboard tape method according to JIS 5400. These conductive pattern materials were each subjected to tape peeling test against checkerboard cuts made thereon. As a result, none of the conductive pattern materials 1, 2 and 3 showed peeling of checkers, demonstrating that they have a good adhesion between the substrate and the thin metal layer.

2. Durability

The conductive pattern materials 1, 2 and 3 having a silver (particle) layer formed thereon thus obtained were each rubbed reciprocally 30 times with a cloth (BEMCOT, produced by Asahi Kasei Corporation) wet with water. The conductive pattern materials thus rubbed were each then visually observed for surface conditions. As a result, none of the conductive pattern materials 1, 2 and 3 showed no peeling of metal (particle) layer. The samples thus rubbed were each then evaluated for layer adhesion by a checkerboard tape method in the same manner as mentioned above. As a result, none of the conductive pattern materials 1, 2 and 3 showed peeling of checkers, demonstrating that they showed no deterioration of adhesion between the metal (particle) layer and the substrate and still exhibited an excellent durability even after rubbed.

Examples 13 to 15

The same substrate having the patterns C1 to C3 formed thereon as obtained in Examples 10 to 12 were each dipped in a 0.1 wt-% aqueous solution of palladium nitrate (produced by Wako Pure Chemical Industries, Ltd.) for 1 hour, and then washed with distilled water. Thereafter, these substrates were each dipped in an electroless plating bath having the following formulation for 20 minutes to prepare conductive pattern materials 4 to 6.

| <Formulation of electroless plating bath> | |
|---|---|
| OPC Copper H T1 (produced by Okuno Chemical Industries Co., Ltd.) | 6 ml |
| OPC Copper H T2 (produced by Okuno Chemical Industries Co., Ltd.) | 1.2 ml |
| OPC Copper H T3 (produced by Okuno Chemical Industries Co., Ltd.) | 10 ml |
| Water | 83 ml |

The surface of the conductive pattern materials 4 to 6 were then observed under optical microscope (OPTI PHOTO-2, produced by Nikon Corporation). The following results were confirmed.

The conductive pattern material 4 (Example 13) was confirmed to have a good pattern having a line having a width of 8 μm and a gap having a width of 8 μm alternatively arranged thereon. The conductive pattern material 5 (Example 14) was confirmed to have a good pattern having a line having a width of 9 μm and a gap having a width of 9 μm alternatively arranged thereon. The conductive pattern material 6 (Example 15) was confined to have a good pattern having a line having a width of 9 μm and a gap having a width of 9 μm alternatively arranged thereon.

[Evaluation of Electrical Conductivity]

The conductive pattern materials 4 to 6 thus obtained were each then measured for surface conductivity at the conductive patterned portion on which the thin copper layer had been formed in the same manner as in Example 10. The following results were obtained.

Conductive pattern material 4: 50 Ω/sq
Conductive pattern material 5: 30 Ω/sq
Conductive pattern material 6: 60 Ω/sq <Evaluation of Metal Layer>

1. Layer strength (Adhesion)

The conductive pattern materials 4 to 6 having a thin copper layer formed thereon were each then evaluated for layer adhesion in the same manner as in Examples 10 to 12. These conductive pattern materials were each subjected to tape peeling test against checkerboard cuts made thereon: As a result, none of the conductive pattern materials 4 to 6 showed peeling of checkers, demonstrating that they have a good adhesion between the substrate and the conductive pattern.

According to the invention, a pattern forming method is provided which can easily form a graft polymer pattern having a high resolution on the surface of a solid.

According to the invention, an arranged fine particle pattern forming method is provided which can be used to form a pattern having a great area and is capable of arranging patternwise fine particles in a desired high resolution range with a simple procedure. In accordance with this arranged fine particle pattern forming method, patternwise integrated fine particles can be so strongly attached to the substrate that they cannot be peeled off the substrate even when the substrate is rubbed or otherwise mechanically treated.

According to the invention, a conductive pattern forming method is provided which is capable of forming a fine pattern having a high resolution and conductivity. The obtained conductive pattern material has a fine pattern having a high resolution and conductivity formed thereon and thus can find a wide application.

According to the invention, a conductive pattern forming method and conductive pattern material are provided which are suitable for the preparation of a material required for the formation of an arbitrary fine pattern having a high conductivity and resolution such as fine electric wiring and electromagnetic wave shield.

According to the invention, a conductive pattern forming method is provided which is capable of forming a finely patterned metal particle-dispersed layer having an excellent adhesion and durability and a high resolution comprising finely divided metal particles dispersed at a high density therein with a high productivity at a simple process. The obtained conductive pattern material has the aforementioned properties.

What is claimed is:

1. A pattern forming method comprising:
   (a) bonding a compound to a substrate, the compound having both a polymerization initiating moiety capable of undergoing photocleavage to initiate radical polymerization and a substrate bonding moiety,
   (b) contacting a radical-polymerizable unsaturated hydrophilic polymer with the substrate wherein the radical-polymerizable unsaturated hydrophilic polymer is formed by reacting a functional group of a hydrophilic polymer with a monomer having an ethylene addition-polymerizable unsaturated group; and
   (c) applying light to the substrate of step (b) patternwise to form a region where a graft polymer is generated and a region where a graft polymer is not generated.

2. The pattern forming method according to claim 1, wherein the polymerization initiating moiety contains a bond selected from the group consisting of a C—C bond, a C—N bond, a C—O bond, a C—Cl bond, a N—O bond, and a S—N bond.

3. The pattern forming method according to claim 1, wherein the graft polymer has a hydrophilic group on its side chain.

4. The pattern forming method according to claim 1, wherein the hydrophilic polymer includes a carboxyl group.

5. The pattern forming method according to claim 1, wherein the monomer having an ethylene addition-polymerizable unsaturated group is selected from the group consisting of (meth)acrylic acid, glycidyl (meth)acrylate, allyl glycidyl ether, 2-isocyanato ethyl (meth)acrylate and 2-methacryloyloxyethyl isocyanate.

* * * * *